United States Patent
Jang et al.

(10) Patent No.: US 9,293,210 B2
(45) Date of Patent: Mar. 22, 2016

(54) MULTI-LEVEL CELL MEMORY DEVICE AND OPERATING METHOD THEREOF

(71) Applicants: Joonsuc Jang, Hwaseong-si (KR); Sangyong Yoon, Seoul (KR)

(72) Inventors: Joonsuc Jang, Hwaseong-si (KR); Sangyong Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/096,281

(22) Filed: Dec. 4, 2013

(65) Prior Publication Data

US 2014/0153331 A1 Jun. 5, 2014

(30) Foreign Application Priority Data

Dec. 4, 2012 (KR) .................. 10-2012-0139768

(51) Int. Cl.
| | |
|---|---|
| *G11C 11/56* | (2006.01) |
| *G11C 16/04* | (2006.01) |
| *G11C 16/26* | (2006.01) |
| *G11C 16/10* | (2006.01) |
| *G11C 7/10* | (2006.01) |

(52) U.S. Cl.
CPC .............. *G11C 16/26* (2013.01); *G11C 7/1039* (2013.01); *G11C 11/5628* (2013.01); *G11C 11/5642* (2013.01); *G11C 16/0483* (2013.01); *G11C 16/102* (2013.01)

(58) Field of Classification Search
CPC ........... G11C 11/5642; G11C 11/5628; G11C 16/0483
USPC .................................................... 365/185.03
See application file for complete search history.

(56) References Cited

U.S. PATENT DOCUMENTS

| | | | |
|---|---|---|---|
| 5,334,888 A * | 8/1994 | Bodas | H03K 19/215 326/52 |
| 7,649,776 B2 | 1/2010 | Abiko et al. | |
| 7,814,401 B2 | 10/2010 | Alrod et al. | |
| 7,876,611 B2 | 1/2011 | Dutta et al. | |
| 7,965,560 B2 | 6/2011 | Tsao et al. | |
| 8,032,810 B2 | 10/2011 | Ishikawa et al. | |
| 8,149,618 B2 | 4/2012 | Kang | |
| 8,576,622 B2 * | 11/2013 | Yoon | G11C 11/5642 365/185.03 |
| 2006/0221739 A1 * | 10/2006 | Kim | 365/203 |
| 2008/0055990 A1 | 3/2008 | Ishikawa et al. | |
| 2008/0151617 A1 | 6/2008 | Alrod et al. | |
| 2008/0209111 A1 | 8/2008 | Kang | |
| 2008/0239812 A1 | 10/2008 | Abiko et al. | |
| 2008/0298134 A1 * | 12/2008 | Kang et al. | 365/185.25 |
| 2009/0190396 A1 * | 7/2009 | Cho et al. | 365/185.03 |
| 2010/0034022 A1 | 2/2010 | Dutta et al. | |
| 2010/0199149 A1 * | 8/2010 | Weingarten | G06F 11/1068 714/773 |
| 2010/0202212 A1 | 8/2010 | Tsao et al. | |

(Continued)

*Primary Examiner* — Hoai V Ho
*Assistant Examiner* — Roberto Mancera
(74) *Attorney, Agent, or Firm* — Harness, Dickey & Pierce, P.L.C.

(57) ABSTRACT

According to an example embodiment of inventive concepts, an operating method of a non-volatile memory device includes: performing a first hard decision read operation that includes applying a first voltage if a selected word line of the non-volatile memory device; storing a result of the first hard decision read operation at a first latch of a page buffer in the non-volatile memory device; performing a second hard decision read operation that includes applying a second voltage to the selected word line, the second voltage being higher than the first voltage; and generating a first soft decision value using a result of the first hard decision read operation stored at the first latch.

17 Claims, 20 Drawing Sheets

(56) References Cited

U.S. PATENT DOCUMENTS

| | | | |
|---|---|---|---|
| 2010/0223538 A1* | 9/2010 | Sakurada | 714/801 |
| 2010/0259993 A1* | 10/2010 | Kang | 365/185.22 |
| 2010/0329021 A1* | 12/2010 | Lee | 365/185.19 |
| 2011/0197015 A1* | 8/2011 | Chae et al. | 711/103 |
| 2011/0235415 A1 | 9/2011 | Park et al. | |
| 2011/0280070 A1* | 11/2011 | Kim et al. | 365/185.03 |
| 2011/0289376 A1 | 11/2011 | Maccarrone et al. | |
| 2012/0051144 A1 | 3/2012 | Weingarten et al. | |
| 2012/0134207 A1 | 5/2012 | Yoon et al. | |
| 2012/0213003 A1* | 8/2012 | Yun et al. | 365/185.09 |
| 2013/0083607 A1* | 4/2013 | Joo | G11C 16/26 365/185.21 |
| 2014/0092686 A1* | 4/2014 | Shim | G11C 16/0408 365/185.17 |

* cited by examiner

<IDEAL>

MULTI-LEVEL CELL MEMORY DEVICE AND OPERATING METHOD THEREOF

CROSS-REFERENCE TO RELATED APPLICATIONS

The present application claims priority under 35 U.S.C. §119 to Korean Patent Application No. 10-2012-0139768 filed Dec. 4, 2012, in the Korean Intellectual Property Office, the entire contents of which are hereby incorporated by reference.

BACKGROUND

Some example embodiments of inventive concepts relate to a non-volatile memory device and/or an operating method thereof.

In general, a memory device may be volatile or non-volatile. A volatile memory device may lose data stored therein at power-off. A non-volatile memory device may retain data stored therein at power-off. For example, the non-volatile memory device may be a read only memory (ROM), an electrically erasable programmable ROM (EEPROM), or the like.

A flash memory device, such as flash EEPROM, may be different from a conventional EEPROM in terms of its structure and operations. The flash memory device may perform an electric erase operation by the block unit and a program operation by the bit unit.

Threshold voltages of programmed memory cells in flash memory devices may vary due to various causes (e.g., floating gate coupling, charge loss with the lapse of time, etc.). A variation in threshold voltages of memory cells may affect the reliability of read data.

SUMMARY

According to an example embodiment of inventive concepts, a method of operating a non-volatile memory device includes: performing a first hard decision read operation that includes applying a first voltage to a selected word line of the non-volatile memory device; storing a result of the first hard decision read operation at a first latch of a page buffer in the non-volatile memory device; performing a second hard decision read operation that includes applying a second voltage to the second word line, the second voltage being higher than the first voltage; and generating a first soft decision value using the result of the first hard decision read operation stored at the first latch.

In example embodiments, the first hard decision read operation may be a coarse read operation.

In example embodiments, the second hard decision read operation is a fine read operation.

In example embodiments, the method may include forming a second soft decision value by performing a soft decision read operation that includes applying a third voltage to the selected word line, and third voltage may be higher than the second voltage. The page buffer may generate soft decision data by performing a logical operation on the first and second soft decision values.

In example embodiments, an additional error bit correct operation may be performed using the soft decision data if an error bit correction operation on the result of the second hard decision read operation fails.

In example embodiments, the logical operation may be an XNOR operation.

In example embodiments, the method may further include: selectively pre-charging bit lines connected to off-state cells of the non-volatile memory device based on a result of the second hard decision read operation at execution of the soft decision read operation. The off-state cells may each have a threshold voltage higher than the second the second voltage.

In example embodiments, the method may further include: performing a third hard decision read operation using a fourth voltage that is higher than the third voltage; and selectively pre-charging bit lines connected to memory cells of the non-volatile memory device having a threshold voltage between the second and the fourth voltage, at execution of the soft decision read operation, if results of the second hard decision read operation and the third hard decision read operation are stored in the page buffer.

According to another example embodiment of inventive concepts, a non-volatile memory device includes: a memory cell array; an address decoder; at least one word line connecting the memory cell array to the address decoder; a page buffer including a plurality of latches; a voltage generator connected to the address decoder, the voltage generator being configured to generate a first read voltage and a second read voltage to be applied to the memory cell array, the second read voltage being higher than the first read voltage; and a control unit configured to control the address decoder and the voltage generator. The control unit is configured to perform first and second hard decision read operations by applying the first voltage and the second voltage, respectively, to a selected word line of the at least one word line. The control unit is configured to generate soft decision data using a result of the first hard decision read operation.

According to another example embodiment of inventive concepts, a method of operating a non-volatile memory device includes: performing a first hard decision read operation that includes applying a first read voltage to a selected word line of the non-volatile memory device; storing a result of the first hard decision read operation at a first latch of a page buffer in the non-volatile memory device; performing a second hard decision read operation that includes generating hard decision data by applying a second read voltage to the selected word line, the second read voltage being higher than the first read voltage; generating a first soft decision value using a result of the first hard decision read operation stored at the first latch without applying a first soft decision read voltage to the selected word line; storing the first soft decision value at a second latch of the page buffer; generating a second soft decision value by applying a soft decision read voltage to the selected word line; storing the second soft decision value at a third latch of the page buffer; and generating soft decision data using the page buffer by performing a logical operation on the first soft decision value and the second soft decision value. The soft decision read voltage may be higher than the second read voltage.

In example embodiments, the logical operation may be an XNOR operation.

In example embodiments, the method may further include: performing an error correction operation using the hard decision data; and performing an additional error correction operation using the soft decision data if the error correction operation using the hard decision data fails.

In example embodiments, at execution of the applying the soft decision read voltage, the method may further include selectively pre-charging bit lines connected to memory cells of the non-volatile memory device based on the result of the second hard decision read operation.

In example embodiments, the method may further include: performing a third hard decision read operation using a fourth voltage that is higher than the third voltage; and at execution of the applying the soft decision read voltage, the method may include selectively pre-charging bit lines connected to memory cells of the non-volatile memory device that each have a threshold voltage between the second and fourth voltage if results of the second hard decision read operation and the third hard decision read operation are stored in the page buffer.

According to yet another example embodiment of inventive concepts, a method of operating a non-volatile memory device including at least one cell string having memory cells arranged between a string select transistor and a ground select transistor in a direction perpendicular to a substrate, the method of operating including: performing a first hard decision read operation that includes applying a first voltage to a selected word line of the non-volatile memory device; storing a result of the first hard decision read operation at a first latch of a page buffer of the non-volatile memory device; performing a second hard decision read operation that includes applying a second voltage to the selected word line, the second voltage being higher than the first voltage; and generating a first soft decision value using a result of the first hard decision read operation stored at the first latch without applying a first soft decision read voltage to the selected word line.

According to an example embodiment of inventive concepts, a method of operating a non-volatile memory device includes: performing a first read operation that includes applying a first voltage to a selected word line of the non-volatile memory device; storing a result of the first read operation at a first latch of a page buffer of the non-volatile memory device; performing a second read operation that includes applying a second voltage to the selected word line, the second voltage being higher than the first voltage; performing an error correction operation on a result of the second read operation; and performing an additional error correction operation using soft decision data if the error correction on the result of the second read operation fails. The soft decision data is generated by: performing a third read operation that includes applying a third voltage to the selected word line; storing a result of the third read operation in an other latch of the page buffer; and performing a logical operation using the result of the first read operation stored in the first latch and the result of the third read operation stored in the other latch. The third voltage is higher than the second voltage.

In example embodiments, the logical operation may be an XNOR operation.

In example embodiments, the first read operation may be a coarse read operation, and second read operation may be a fine read operation.

In example embodiments, at execution of the third read operation, the method may include selectively pre-charging bit lines connected to memory cells of the non-volatile memory device based on the result of the second read operation.

In example embodiments, the non-volatile memory device may include a plurality of a NAND strings arranged in rows and columns, a plurality of bit lines. Each one of the plurality of NAND strings may include a plurality of memory cells stacked vertically on each other between a ground selection transistor and a string selection transistor. Each one of the plurality of bit lines may be connected to the plurality of NAND strings in a same column. The selected word line may be one of a plurality of word lines in the non-volatile memory device. Each one of the plurality of word lines may be connected to a corresponding one of the plurality of memory cells at a same height in the plurality of NAND strings in a same row.

According to example embodiments of inventive concepts, it is possible to improve a read speed and reduce power consumption at execution of a soft decision read operation of a multi-bit non-volatile memory, and/or improve the reliability of a non-volatile memory.

BRIEF DESCRIPTION OF THE FIGURES

The above and other features will become apparent from the following description of non-limiting embodiments with reference to the following figures, wherein like reference numerals refer to like parts throughout the various figures unless otherwise specified, and wherein.

DETAILED DESCRIPTION

Figure 1:
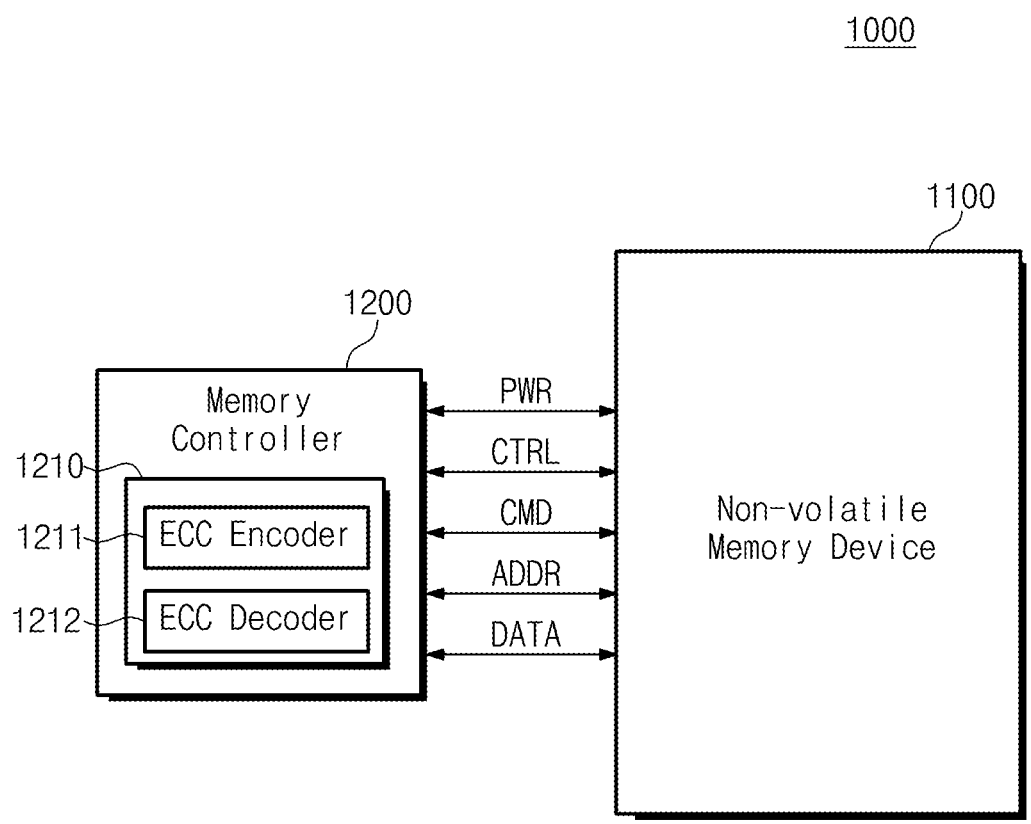
FIG. 1 is a block diagram schematically illustrating a non-volatile memory system according to example embodiment of inventive concepts.

Example embodiments of inventive concepts will be described in detail with reference to the accompanying drawings. Example embodiments of inventive concepts, however, may be embodied in various different forms, and should not be construed as being limited only to the illustrated embodiments. Rather, these embodiments are provided as examples so that this disclosure will be thorough and complete, and will fully convey the scope of example embodiments of inventive concepts to those skilled in the art. Accordingly, known processes, elements, and techniques may not described. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on").

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

FIG. 1 is a block diagram schematically illustrating a non-volatile memory system according to an example embodiment of inventive concepts. Referring to FIG. 1, a non-volatile memory system 1000 may include a non-volatile memory device 1100 and a memory controller 1200. The non-volatile memory system 1000 may include all non-volatile memory based data storage media such as a memory card, a USB memory, a solid state drive (SSD), and so on.

The non-volatile memory device 1100 may perform an erase, write and/or read operation according to a control of the memory controller 1200. The non-volatile memory device 1100 may receive a command CMD, an address ADDR and data DATA through input/output lines. The non-volatile memory device 1100 may receive a power PWR through a power line and a control signal CTRL through a control line. The control signal may include a command latch enable (CLE) signal, an address latch enable (ALE) signal, a chip enable (nCE) signal, a write enable (nWE) signal, a read enable (nRE) signal, and so on.

The memory controller 1200 may control an overall operation of the non-volatile memory device 1100. The memory controller 1200 may include an ECC engine 1210 for correcting error bits. The ECC engine 1210 may include an ECC encoder 1211 and an ECC decoder 1212.

The ECC encoder 1211 may perform error correction encoding on data to be programmed at the non-volatile memory device 1100 to form data to which parity bits are added. The parity bits may be stored at the non-volatile memory device 1100.

The ECC decoder 1212 may perform error correction decoding on data read from the non-volatile memory device 1100. The ECC decoder 1212 may determine whether the error correction decoding is successful, and may output an instruction signal according to the determination result. The ECC decoder 1212 may correct error bits of data using parity bits generated at ECC encoding.

If the number of error bits exceeds a correctable error bit limit, the ECC engine 1210 may not correct error bits. In this case, the ECC engine 1210 may generate an error correction fail signal.

The ECC engine 1210 may correct an error using an LDPC (low density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. However, example embodiments of inventive concepts are not limited thereto. The ECC engine 1210 may include an error correction circuit, an error correction system, and an error correction device.

As described above, when the number of error bits exceeds a correctable error bit limit, the ECC engine 1210 may generate an error correction fail signal. In an example embodiment of inventive concepts, since the ECC engine 1210 may perform an error bit correcting operation using hard decision read data and soft decision data, an error bit correction capacity may be improved.

Figure 2A:
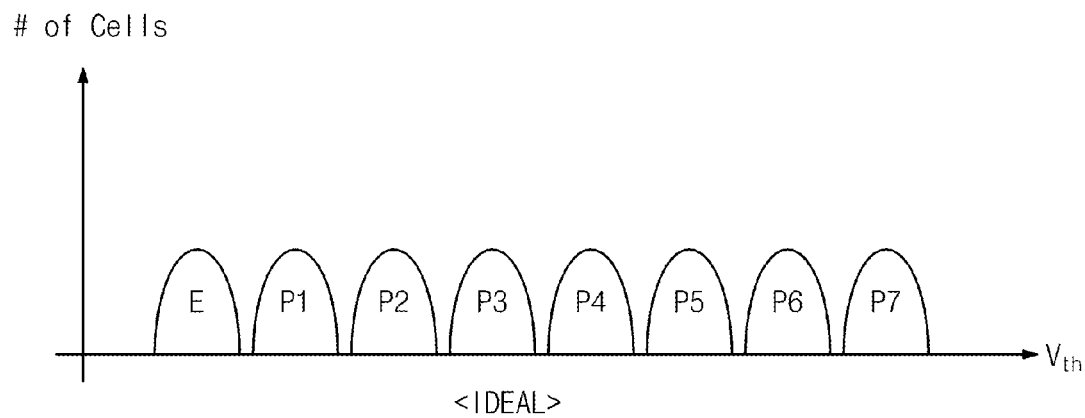
FIG. 2A is a diagram schematically illustrating threshold voltage distributions corresponding to program and erase states after programming of a multi-level cell (3-bit MLC) non-volatile memory device.

FIG. 2A is a diagram schematically illustrating threshold voltage distributions corresponding to program and erase states after programming of a multi-level cell (3-bit MLC) non-volatile memory device. In an MLC flash memory where k-bit data is programmed at a memory cell, the memory cell may have one of $2^k$ threshold voltage distributions.

Threshold voltages of memory cells programmed with the same data may form a particular range of threshold voltage distribution due to a characteristic difference between memory cells. The threshold voltage distributions may correspond to $2^k$ data values which are generated by k data bits. In a 3-bit MLC, as illustrated in FIG. 2A, threshold voltage distributions corresponding to seven program states P1 to P7 and a threshold voltage distribution corresponding to an erase state may be formed. FIG. 2A shows such an ideal case that threshold voltage distributions each having a range of read voltage margin are not overlapped. In other words, as shown in FIG. 2A, in an ideal case, the threshold voltage voltages corresponding to different program states (e.g., P1 and P2) do not overlap.

Figure 2B:
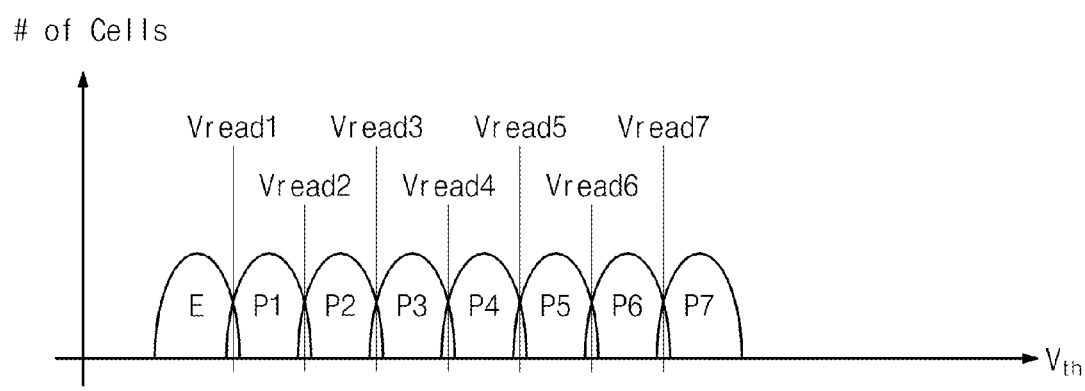
FIG. 2B is a diagram schematically illustrating threshold voltage distributions of program and erase states varied due to characteristic deterioration of flash memory cells when a 3-bit MLC flash memory is programmed and then experiences iterative program and read operations.

FIG. 2B is a diagram schematically illustrating threshold voltage distributions of program and erase states varied due to characteristic deterioration of flash memory cells when a 3-bit MLC flash memory is programmed and then experiences iterative program and read operations.

A flash memory may experience such a phenomenon that electrons trapped at a floating gate or tunnel oxide film are discharged over time. This may be referred to as charge loss. The charge loss may be accelerated when the tunnel oxide film is deteriorated by iterative program and erase operations. The charge loss may make a threshold voltage of a memory cell decrease. For example, a threshold voltage distribution may be shifted in a left side.

The program disturbance, erase disturbance and/or back pattern dependency phenomenon may cause an increase in threshold voltages. As characteristics of memory cells are deteriorated by the above-described causes, threshold voltage distributions of adjacent states may be overlapped as illustrated in FIG. 2B.

If a particular read voltage is applied to a selected word line under a condition where threshold voltage distributions are overlapped, read data may include a lot of errors. For example, if a state of a memory cell sensed when a read voltage Vread3 is applied to a selected word line is an on state, the on state may indicate read data existing on a state S2. If a state of a memory cell sensed when the read voltage Vread3 is applied to the selected word line is an off state, the off state may indicate read data existing on a state S3. In a case where threshold voltage distributions are overlapped, however, a memory cell in an off state may be read as an on state. Thus, if threshold voltage distributions are overlapped, read data may include errors.

Figure 3:
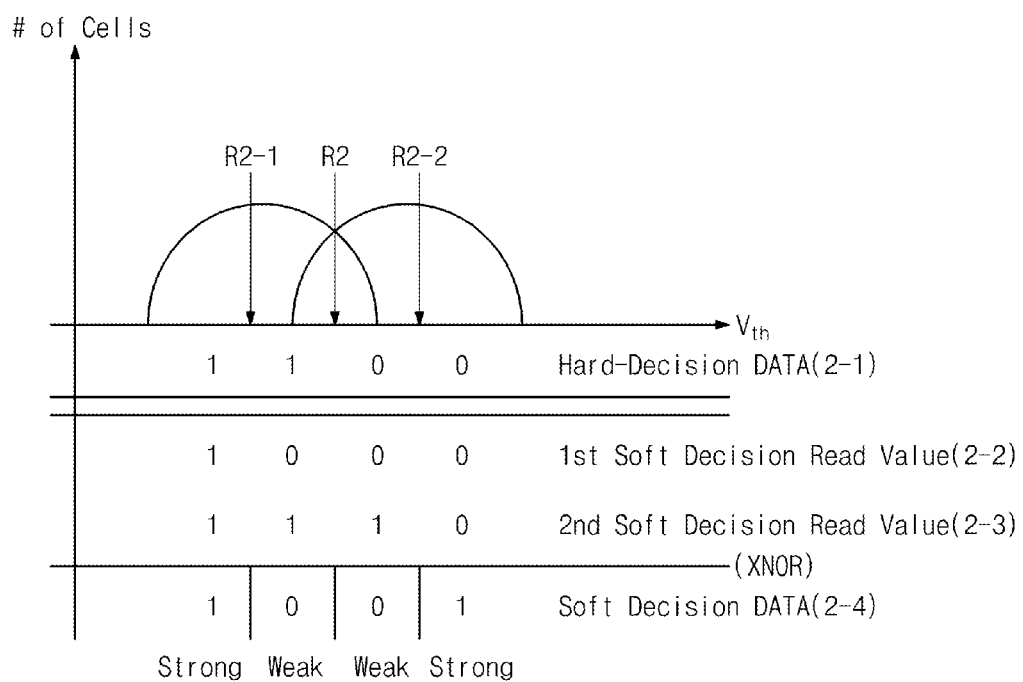
FIG. 3 is a diagram schematically illustrating read voltages at a 2-bit soft decision read operation and formation of soft decision data.

FIG. 3 is a diagram schematically illustrating read voltages at a 2-bit soft decision read operation and formation of soft decision data. A read command may include a hard decision read command and a soft decision read command.

A hard decision read operation may indicate a read operation on programmed data. When a hard decision read voltage is applied to a selected word line, data 1 or data 0 may be read according to an on or off state of a selected memory cell. Referring to FIG. 3, a symbol "R2" may indicate a hard decision read voltage. If a memory cell is decided as an on state at applying of the hard decision read voltage R2, hard decision data 2-1 may be "1". If a memory cell is decided as an off state at applying of the hard decision read voltage R2, the hard decision data 2-1 may be "0". A soft decision read operation may mean an operation to inform for adding the reliability to hard decision read data using a plurality of variable read voltages (or, soft decision read voltages) having voltage levels different from that of the hard decision read voltage R2.

A 2-bit soft decision read operation may be performed using soft decision read voltages R2-1 and R2-2. First soft decision read value 2-2 decided according to an on or off state of a memory cell at applying of the soft decision read voltages R2-1 may be "1", "0", "0", "0". Second soft decision read value 2-3 decided according to an on or off state of a memory cell at applying of the soft decision read voltages R2-2 may be "1", "1", "1", "0".

Soft decision data 2-4 may be decided by performing a logic gate operation on the first soft decision read value 2-2 and the second soft decision read value 2-3. In particular, soft decision data may be generated through an XNOR operation. The soft decision data 2-4 thus generated may be provided to an ECC decoder 1212 of a memory controller 1200 (refer to FIG. 1). The soft decision data may add the reliability on hard decision data. For example, if the soft decision data 2-4 is "1", the reliability of the hard decision data may be "strong". On the other hand, if the soft decision data 2-4 is "0", the reliability of the hard decision data may be "weak".

Figure 4:
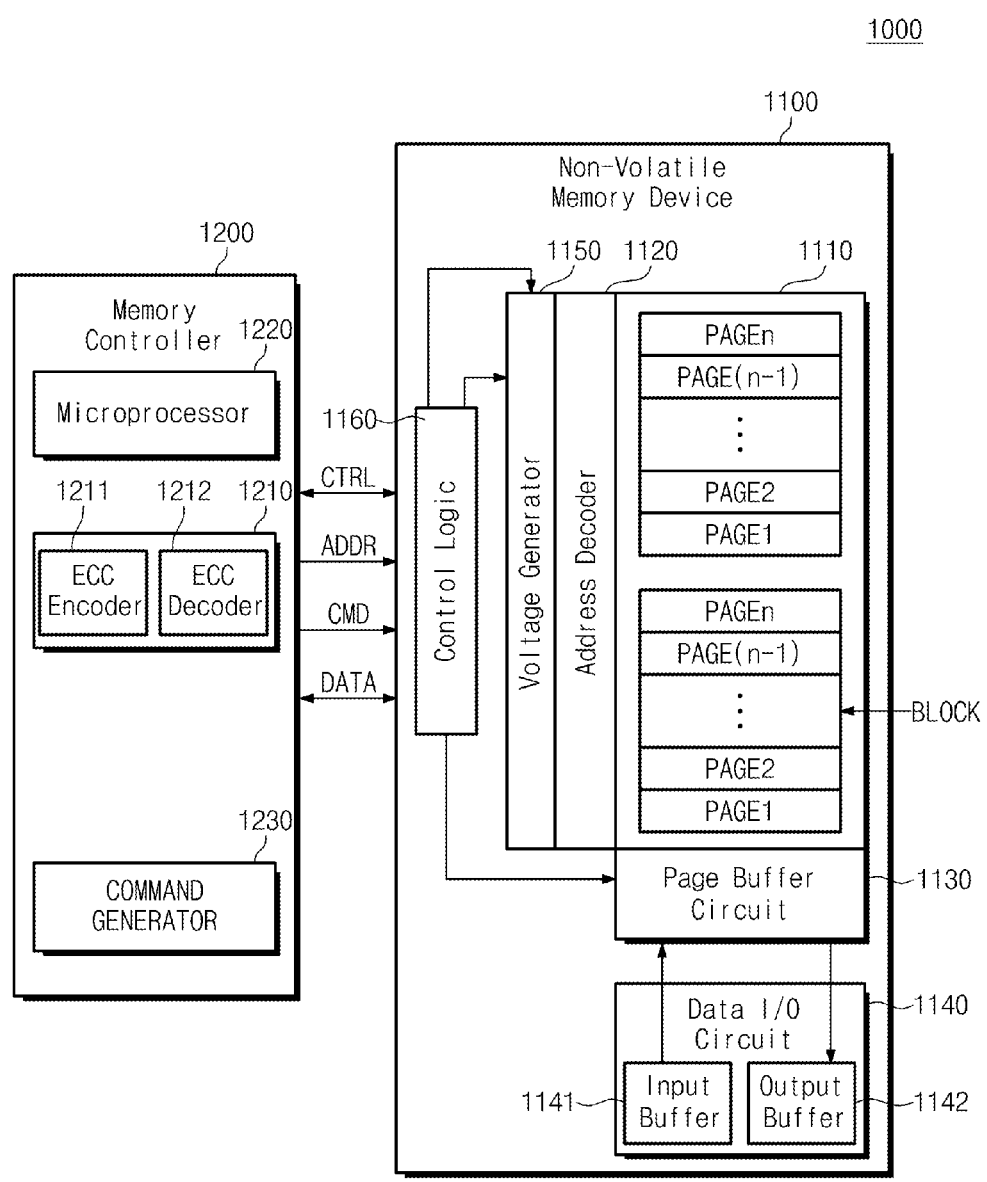
FIG. 4 is a block diagram schematically illustrating a memory system according to an example embodiment of inventive concepts.

FIG. 4 is a block diagram schematically illustrating a memory system according to an example embodiment of inventive concepts. Referring to FIG. 4, a memory system 1000 may include a non-volatile memory device 1100 and a memory controller 1200. Here, the non-volatile memory device 1100 may be a flash memory device.

The non-volatile memory device 1100 may include a memory cell array 1110, an address decoder 1120, a page buffer circuit 1130, a data input/output circuit 1140, a voltage generator 1150, and control logic 1160.

The memory cell array 1110 may be formed of a plurality of memory blocks. Each memory block may include a plurality of pages PAGE1 to PAGEn. Here, a page may mean a set of memory cells connected with a word line. Program and read operations may be performed by the page unit, and an erase operation may be performed by the block unit.

The address decoder 1120 may be connected to the memory cell array 1110 through word lines, and may receive a word line voltage from the voltage generator 1150. At a program or read operation, the address decoder 1120 may provide a program or read voltage to a word line corresponding to an address ADDR.

The page buffer circuit 1130 may be connected to the memory cell array 1110 through bit lines. The page buffer circuit 1130 may include page buffers each connected with one or more bit lines, and each page buffer may include a plurality of latches. The page buffer circuit 1130 may temporarily store data to be programmed at a selected page or data read from the selected page.

The data input/output circuit 1140 may include an input buffer 1141 and an output buffer 1142. The input buffer 1141 may transfer data input from the memory controller 1200 to the page buffer circuit 1130. The output buffer 1142 may provide data input from the page buffer circuit 1130 to the memory controller 1200.

The voltage generator 1150 may receive a power PWR from the memory controller 1200 to generate a word line voltage needed to read or write data. The word line voltage may be provided to the address decoder 1120.

The control logic 1160 may control reading, programming, and/or erasing of the non-volatile memory device 1100 using a command CMD, an address ADDR, and a control signal CTRL.

As illustrated in FIG. 4, the memory controller 1200 may include an ECC engine 1210, a microprocessor 1220, and a command generator 1230. The ECC engine 1210 may include an ECC encoder 1211 and an ECC decoder 1212 as described above.

The microprocessor 1220 may control an overall operation of the memory controller 1200. The microprocessor 1220 may analyze a command provided from a host to control an overall operation of the non-volatile memory device 1100.

The command generator 1230 may analyze a command from the microprocessor 1220 to generate a command suitable for the non-volatile memory device 1100 according to the analyzing result. The command generator 1230 may apply the generated command to the non-volatile memory device 1100. In particular, the command generator 1230 may provide a hard decision read command and a soft decision command to the non-volatile memory device 1100.

Figure 5:
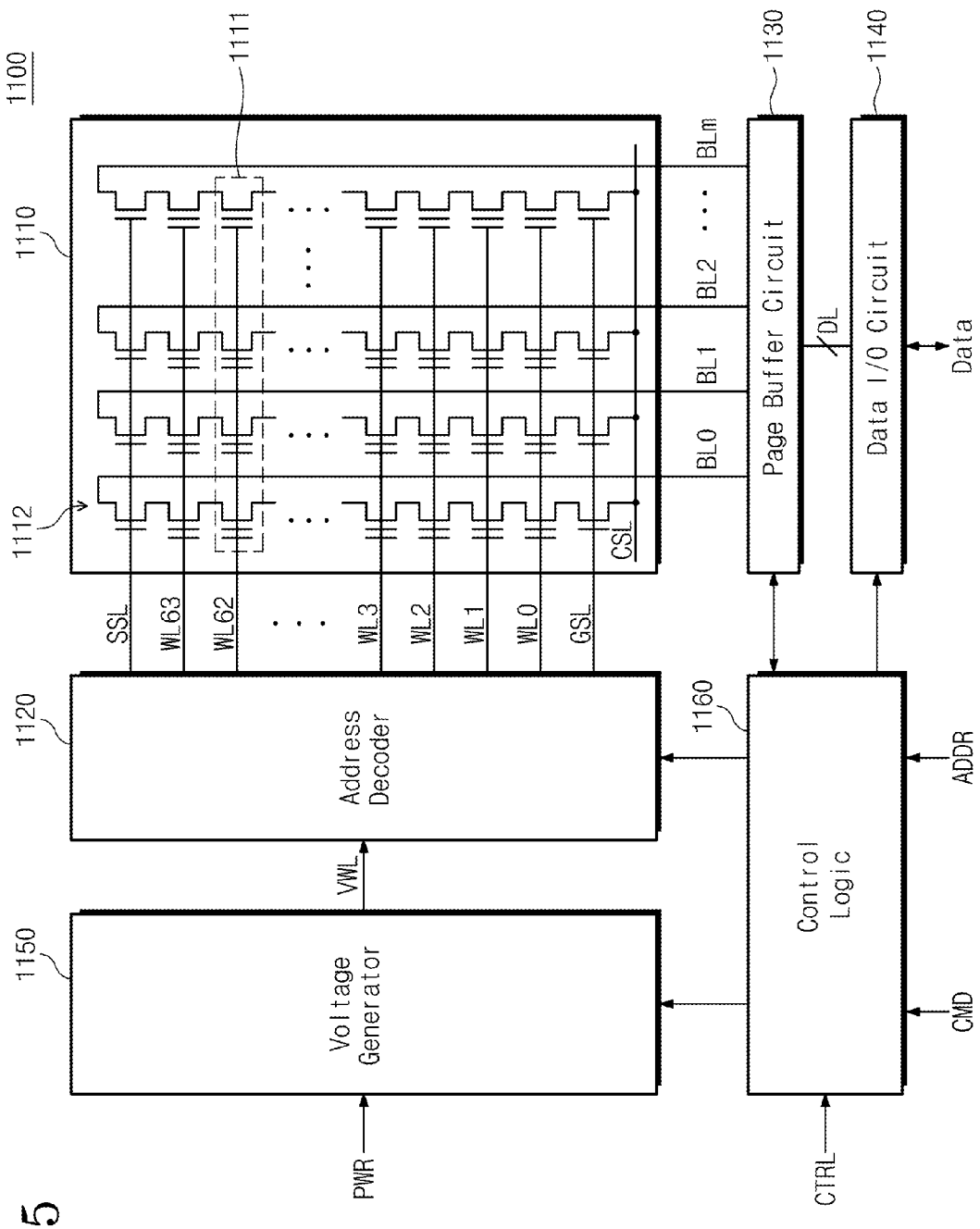
FIG. 5 is a block diagram schematically illustrating a flash memory device as an example of a non-volatile memory device of FIG. 4.

FIG. 5 is a block diagram schematically illustrating a flash memory device as an example of a non-volatile memory device of FIG. 4. Referring to FIG. 5, a flash memory device 1100 may include a memory cell array 1110, an address decoder 1120, a page buffer circuit 1130, a data input/output circuit 1140, a voltage generator 1150, and control logic 1160.

In FIG. 5, there is illustrated an example in which the memory cell array 1110 includes a memory block. However, the memory cell array 1110 can include more memory blocks. A reference number "1111" may indicate a page. Respective pages may be formed of a plurality of memory cells. Each memory cell may be formed of a cell transistor having a control gate and a floating gate.

The memory cell array 1110 may include a plurality of cell strings 1112. Each cell string 1112 may include a string select transistor connected with a string select line SSL, a plurality of memory cells each connected with a plurality of word lines WL0 to WL63 and a ground select transistor connected with a ground select line GSL. In each cell string, a string select transistor may be connected with a bit line and a ground select transistor may be connected with a common source line CSL.

A memory cell may store one data bit or two or more data bits. A memory cell storing one data bit may be referred to as a single level cell (SLC) or a single bit cell. A memory cell storing two or more data bits may be referred to as a multi-level cell (MLC) or a multi-bit cell.

In a 2-bit MLC flash memory device, two logical pages may be stored at a physical page. Here, a logical page may indicate a set of data bits to be programmed at a physical page at the same time. In a 3-bit MLC flash memory device, three logical pages may be stored at a physical page.

Referring to FIG. 5, the address decoder 1120 may be connected with the memory cell array 1110 through the select lines SSL and GSL and the word lines WL0 to WL63. At a read operation, the address decoder 1120 may select a word line (e.g., WL62) in response to an address ADDR.

The page buffer circuit 1130 may be connected with the memory cell array 1110. The page buffer circuit 1130 may include a plurality of page buffers, each of which includes a plurality of latches. A page buffer may be connected with a bit line. This structure may be referred to as the all bit line structure. A page buffer may be connected with two or more bit lines. This structure may be referred to as the shield bit line structure. The page buffer circuit 1130 may temporarily store data to be programmed at a selected page 1111 or data read from the selected page 1111.

Figure 6:
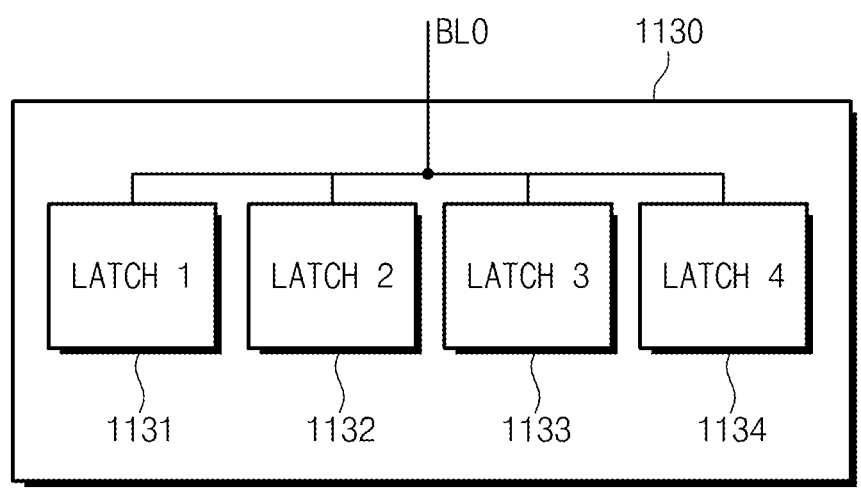
FIG. 6 is a block diagram schematically illustrating a page buffer circuit of FIG. 5.

FIG. 6 is a block diagram schematically illustrating a page buffer circuit of FIG. 5. Referring to FIG. 6, a page buffer connected with one bit line (e.g., BL0) (or, connected with two or more bit lines) may include at least one or more latches 1131, 1132, 1133, and 1134. In FIG. 6, there is illustrated an example in which a page buffer includes four latches 1131, 1132, 1133, and 1134. However, example embodiments of inventive concepts are not limited thereto. The four latches 1131, 1132, 1133, and 1134 may be electrically connected.

A first latch 1131 may be a sense latch for sensing data of a memory cell. At an MLC program operation, second and third latches 1132 and 1133 may be a first data latch for storing a particular data bit and a second data latch for storing another particular data bit. A fourth latch 1134 may be a latch for storing input data or output data.

A page buffer circuit 1130 may perform a logical operation (e.g., an XNOR and/or XOR operation) on data of the four latches 1131, 1132, 1133, and 1134 according to a control of control logic 1160. For example, as illustrated in FIG. 3, it is assumed that a first soft decision value 2-2 is stored at the first data latch 1132 and a second soft decision value 2-3 is stored at the second data latch 1133. Under a control of the control logic 1160, the page buffer circuit 1130 may perform an XNOR operation on values stored at the first and second data latches 1132 and 1133 to generate soft decision data 2-4.

Returning to FIG. 4, a non-volatile memory device 1100 provided with a hard decision read command may perform a first hard decision read operation. Under a control of the control logic 1160, a voltage generator 1150 may generate a first voltage to apply the first voltage to a selected word line. The non-volatile memory device 1100 may perform a hard decision read operation, and may store a result of the hard decision read operation at the first latch 1131 of a corresponding page buffer in a page buffer circuit 1130.

Hard decision read data as a result obtained by executing the hard decision read command may be provided to an ECC decoder 1212. The ECC decoder 1212 may correct an error bit using hard decision data. If error bit correction is failed, it may be again performed using soft decision read data for providing the reliability to the hard decision data.

Figure 7:
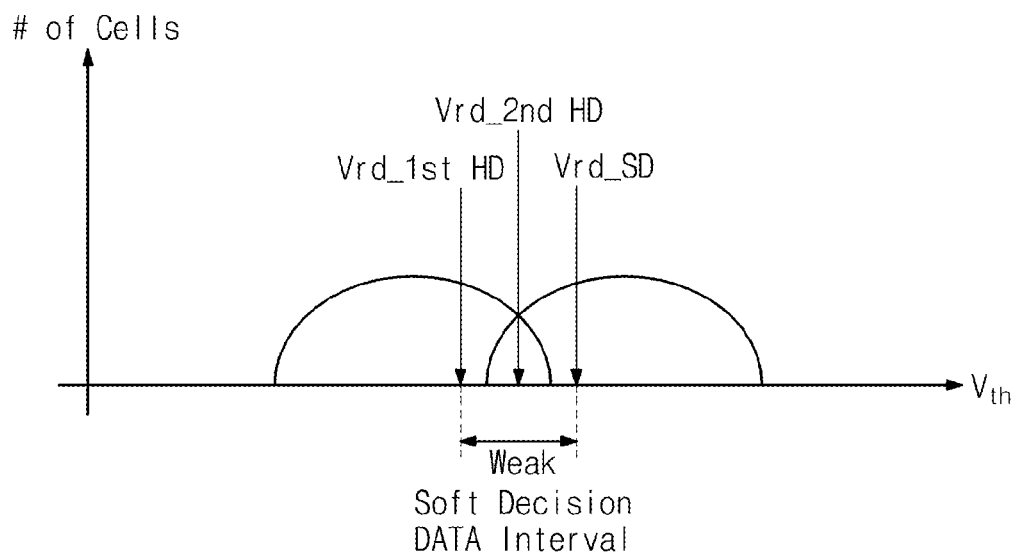
FIG. 7 is a diagram schematically illustrating a soft decision data generating method of a memory system illustrated in FIG. 4.

At this time, the voltage generator 1150 may generate a second voltage higher than the first voltage to apply it to the selected word line. The first voltage may be a coarse read voltage and the second read voltage may be a fine read voltage. A read operation using the coarse read voltage may be a read operation performed to remove noise due to the interference between memory cells. For example, as shown in FIG. 7 of the present application, the first hard decision read voltage Vrd__1st HD may be a coarse read voltage set to a value where two threshold voltage distributions of cells in FIG. 7 do not overlap. Similarly, as shown in FIG. 7 of the present application, the second hard decision read voltage Vrd__2nd HD may be set to a value where two threshold voltage distributions of cells overlap.

The non-volatile memory device 1100 may perform a second hard decision read operation. The control logic 1160 may generate a first soft decision value using (and/or retrieving) a result of the first hard decision read operation stored at the first latch 1131 to store it at the second latch 1132 of a corresponding to page buffer in the page buffer circuit 1130.

The non-volatile memory device 1100 may not use a separate soft decision read voltage for generation of the first soft decision value. Thus, since a resultant value of a coarse hard decision read operation is used without applying of a separate soft decision read voltage, a read delay due to a soft decision read operation may be limited (and/or prevented).

The voltage generator 1150 may generate a third voltage higher than the second voltage to apply it to the selected word line. The non-volatile memory device 1100 may generate a second soft decision value by performing a soft decision read operation using the third voltage applied to the selected word line. The page buffer circuit 1130 may perform a logical operation on the first and second soft decision values to generate soft decision data as a result of the logical operation. For example, the page buffer circuit 1130 may perform an XNOR operation using a combination of a plurality of latches to generate soft decision data.

The soft decision data thus generated may be provided to the ECC decoder 1212 for error bit correction. In particular, when error bit correction on a result of the second hard decision operation is failed, the ECC decoder 1212 may perform error bit correction using the soft decision data.

In some example embodiments of inventive concepts, a memory system 1000 in FIG. 4 may generate a first soft decision value using (and/or retrieving) a first hard decision read result stored at a first latch without using a soft decision read voltage and provide the first soft decision value to the ECC decoder 1212 without an additional soft decision read operation. The ECC decoder 1212 may perform error bit correction on a result of the second hard decision read operation using the first soft decision value.

Referring to FIGS. 4 to 6, a result of a first hard decision read operation may be stored at a first latch 1131, and a first soft decision value may be formed using (and/or retrieving) information stored at the first latch 1131. A second soft decision value obtained by performing a soft decision read operation using a third voltage may be stored at a second latch.

Under a control of the control logic 1160, the page buffer circuit 1130 may perform an XNOR operation on first hard decision read result information stored at the first latch 1131 and a second soft decision value stored at the second latch 1132 to form soft decision data. A soft decision value stored at the first latch 1131 of the page buffer circuit 1130 has to be retained even at execution of a soft decision read operation.

FIG. 7 is a diagram schematically illustrating a soft decision data generating method of a memory system illustrated in FIG. 4. In FIG. 7, a horizontal axis may indicate a threshold voltage and a vertical axis may indicate the number of memory cells. In FIG. 7, there may be illustrated two program states.

Referring to FIGS. 4 to 7, a non-volatile memory device 1100 may perform a first hard decision read operation using a first hard decision read voltage Vrd__1st HD. At the first hard decision read operation, data may be divided into "1" and "0" on the basis of the first hard decision read voltage Vrd__1st HD. Memory cells having a threshold voltage lower than the first hard decision read voltage Vrd__1st HD may correspond to data "1", and non-volatile memory cells having a threshold voltage higher than the first hard decision read voltage Vrd__1st HD may correspond to data "0".

First hard decision read data may be stored at a first latch 1131 (refer to FIG. 6). The non-volatile memory device 1100 may perform a second hard decision read operation using a second hard decision read voltage Vrd__2nd HD. A result of the second hard decision read operation may be provided to an ECC decoder 1212. The ECC decoder 1212 may perform error bit correction using the result of the second hard decision read operation.

The non-volatile memory device 1100 may perform a soft decision read operation using a soft decision read voltage Vrd_SD. Memory cells having a threshold voltage lower than the soft decision read voltage Vrd_SD may correspond to data "1", and non-volatile memory cells having a threshold voltage higher than the soft decision read voltage Vrd_SD may correspond to data "0". Thus, a memory system 1000 may generate second soft decision values of "1" and "0" on the basis of a soft decision voltage.

A page buffer circuit 1130 may store a second soft decision value at a second latch 1132, and may generate soft decision data by performing an XNOR operation on the second soft decision value stored at the second latch 1132 and the first hard decision read data stored at the first latch 1131. The soft decision data may be provided to the ECC decoder 1212 for error bit correction. The soft decision data may improve reliability with respect to hard decision data. In other words, if soft decision data is "1", hard decision data may mean "strong". If soft decision data is "0", hard decision data may mean "weak".

Figure 8:
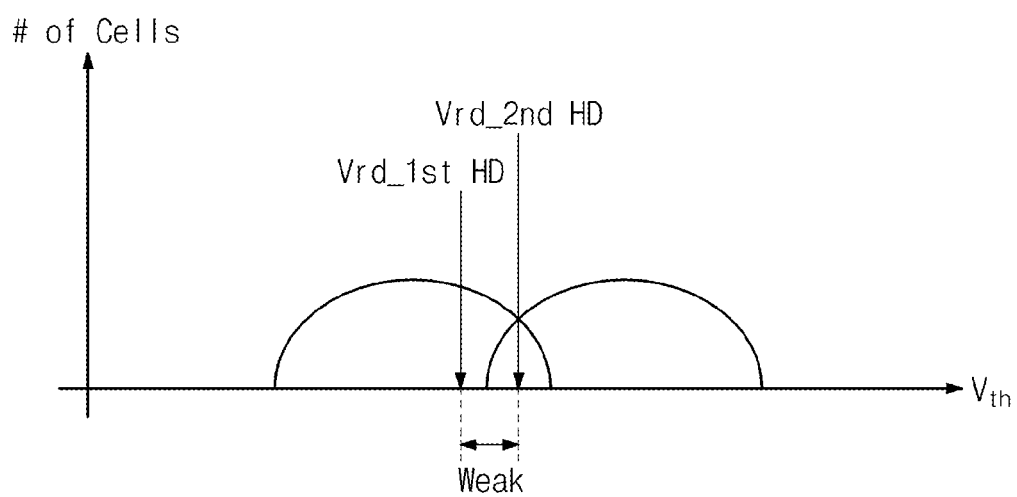
FIG. 8 is a diagram schematically illustrating another soft decision data generating method of a memory system illustrated in FIG. 4'

FIG. 8 is a diagram schematically illustrating another soft decision data generating method of a memory system illustrated in FIG. 4. A non-volatile memory device 1100 may perform a first hard decision read operation using a first hard decision read voltage Vrd__1st HD.

As described with reference to FIG. 7, at the first hard decision read operation, data may be divided into "1" and "0" on the basis of the first hard decision read voltage Vrd__1st HD.

Soft decision data illustrated in FIG. 8 may correspond to a first soft decision value illustrated in FIG. 7. The soft decision data may be stored at a first latch 1131. The non-volatile memory device 1100 may perform a second hard decision read operation using a second hard decision read voltage Vrd__2nd HD and perform a result of the second hard decision read operation to an ECC decoder 1212. The ECC decoder 1212 may perform error bit correction using the result of the second hard decision read operation.

The non-volatile memory device 1100 may provide the soft decision data stored at the first latch 1131 to the ECC decoder 1212. The soft decision data may add the reliability with respect to hard decision data. In other words, if soft decision data is "1", hard decision data may mean "strong". If soft decision data is "0", hard decision data may mean "weak".

Referring to FIG. 8, since non-volatile memory cells having threshold voltages corresponding to the first hard decision read voltage Vrd_1$^{st}$ HD and the second hard decision read voltage Vrd_2nd HD corresponds to soft decision data of "0", the reliability of hard decision data may be low. On the other hand, since non-volatile memory cells having threshold voltages lower than the first hard decision read voltage Vrd_1 stHD correspond to soft decision data of "1", the reliability of hard decision data may be high.

Figure 9:
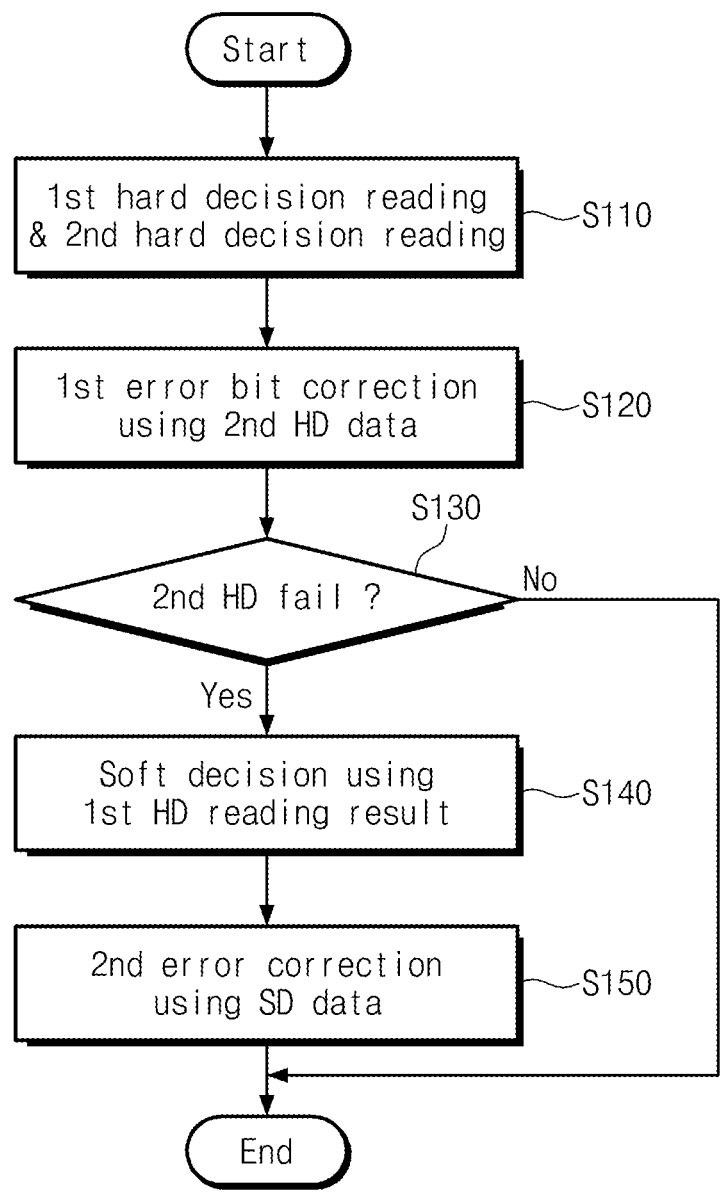
FIG. 9 is a flow chart schematically illustrating an operation of a memory system according to an example embodiment of inventive concepts.

FIG. 9 is a flow chart schematically illustrating an operation of a memory system according to an example embodiment of inventive concepts.

In operation S110, a non-volatile memory device 1100 may perform a first hard decision read operation using a first voltage and a second hard decision read operation using a second voltage higher than the first voltage.

In operation S120, an ECC decoder 1212 may perform first error bit correction using a result of a second hard decision read operation.

In operation S130, if error bit correction on second hard decision read data is failed, the method may proceed to operation S140. If error bit correction on second hard decision read data is successfully performed, the method may be ended.

In operation S140, the non-volatile memory device 1100 may generate soft decision data using a result of a first hard decision read operation. Here, the result of the first hard decision read operation may be stored at a page buffer circuit 1130 of the non-volatile memory device 1100. The non-volatile memory device 1100 may perform a soft decision read operation using a third voltage higher than the second voltage to generate soft decision data.

Also, during execution of the first error bit correction, the non-volatile memory device 1100 may perform a soft decision read operation using the third voltage higher than the second voltage to generate soft decision data.

In operation S150, the ECC decoder 1212 may perform second error bit correction using the soft decision data.

Figure 10:
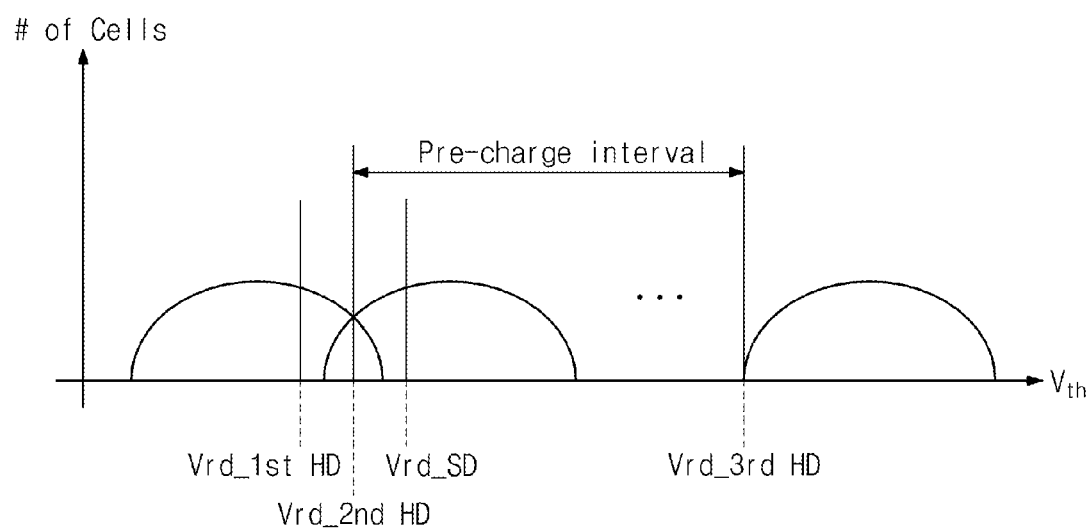
FIG. 10 is a diagram schematically illustrating a bit line pre-charging method at a soft decision read operation.

FIG. 10 is a diagram schematically illustrating a bit line pre-charging method at a soft decision read operation. Referring to FIG. 10, a non-volatile memory device 1100 may have at least three program states.

The non-volatile memory device 1100 may perform a first hard decision read operation using a first voltage and a second hard decision read operation using a second voltage higher than the first voltage. A third hard decision read operation may be performed using a third voltage higher than the second voltage. At execution of a soft decision read operation, the non-volatile memory device 1100 may selectively pre-charge bit lines of memory cells referring to results of the second and third hard decision read operations.

At execution of a soft decision read operation, bit lines corresponding to off-state cells each having a threshold voltage higher than the second hard decision read voltage may be selectively pre-charged based on the result of the second hard decision read operation. Also, when a soft decision read operation is performed using a soft decision read voltage (e.g., a third read voltage), the non-volatile memory device 1100 may selectively pre-charge bit lines corresponding to memory cells each having a threshold voltage between the second hard decision read voltage and the third hard decision read voltage.

Referring to FIGS. 6 and 10, at execution of a soft decision read operation, if a result of the second hard decision read operation is stored at a first latch 1131 and a result of the third hard decision read operation is stored at a second latch 1132, the non-volatile memory device 1100 may selectively pre-charge bit lines at the soft decision read operation, based on values stored at the first and second latches 1131 and 1132. The non-volatile memory device 1100 has to retain values stored at the first and second latches 1131 and 1132 up to a soft decision read operation. The non-volatile memory device 1100 may reduce power consumption by selectively pre-charging bit lines at the soft decision read operation.

Figure 11:
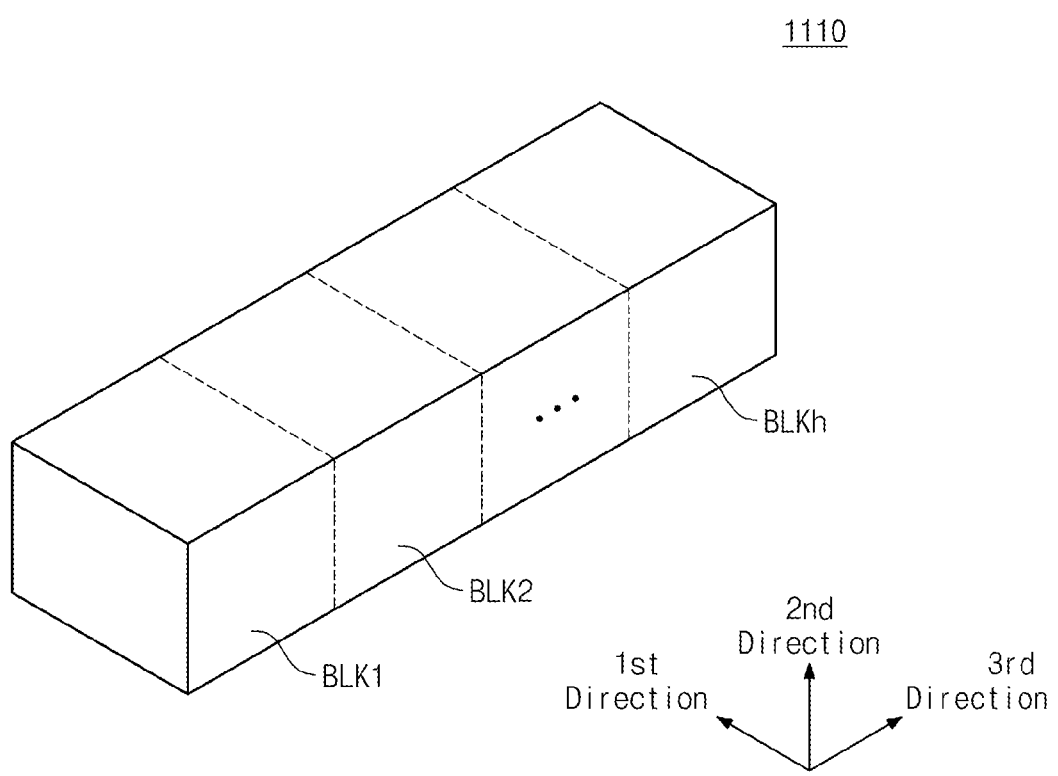
FIGS. 11 to 15 are diagrams schematically illustrating a three-dimensional flash memory device according to some example embodiments of inventive concepts.

FIGS. 11 to 15 are diagrams schematically illustrating a three-dimensional flash memory device according to some example embodiments of inventive concepts. FIG. 11 is a block diagram of the memory cell array 1110 of FIG. 4. Referring to FIG. 11, the memory cell array 1110 may include a plurality of memory blocks BLK1 to BLKh. Each of the memory blocks BLK1 to BLKh may have a three dimensional structure (e.g., a vertical structure). For example, each memory block may include structures extending along first to third directions.

Each memory block may include a plurality of NAND strings NS extending along the second direction. A plurality of NAND strings NS may be provided along the first and third directions. Each NAND string NS may be connected to a bit line BL, at least one string select line SSL, at least one ground select line GSL, a plurality of word lines WL, at least one dummy word line DWL, and a common source line CSL. Each of the memory blocks BLK1 to BLKh may be connected to a plurality of bit lines BL, a plurality of string select lines SSL, a plurality of ground select lines GSL, a plurality of word lines WL, a plurality of dummy word lines DWL, and a plurality of common source lines CSL. The memory blocks BLK1 to BLKh will be more fully described with reference to FIG. 12.

Figure 12:
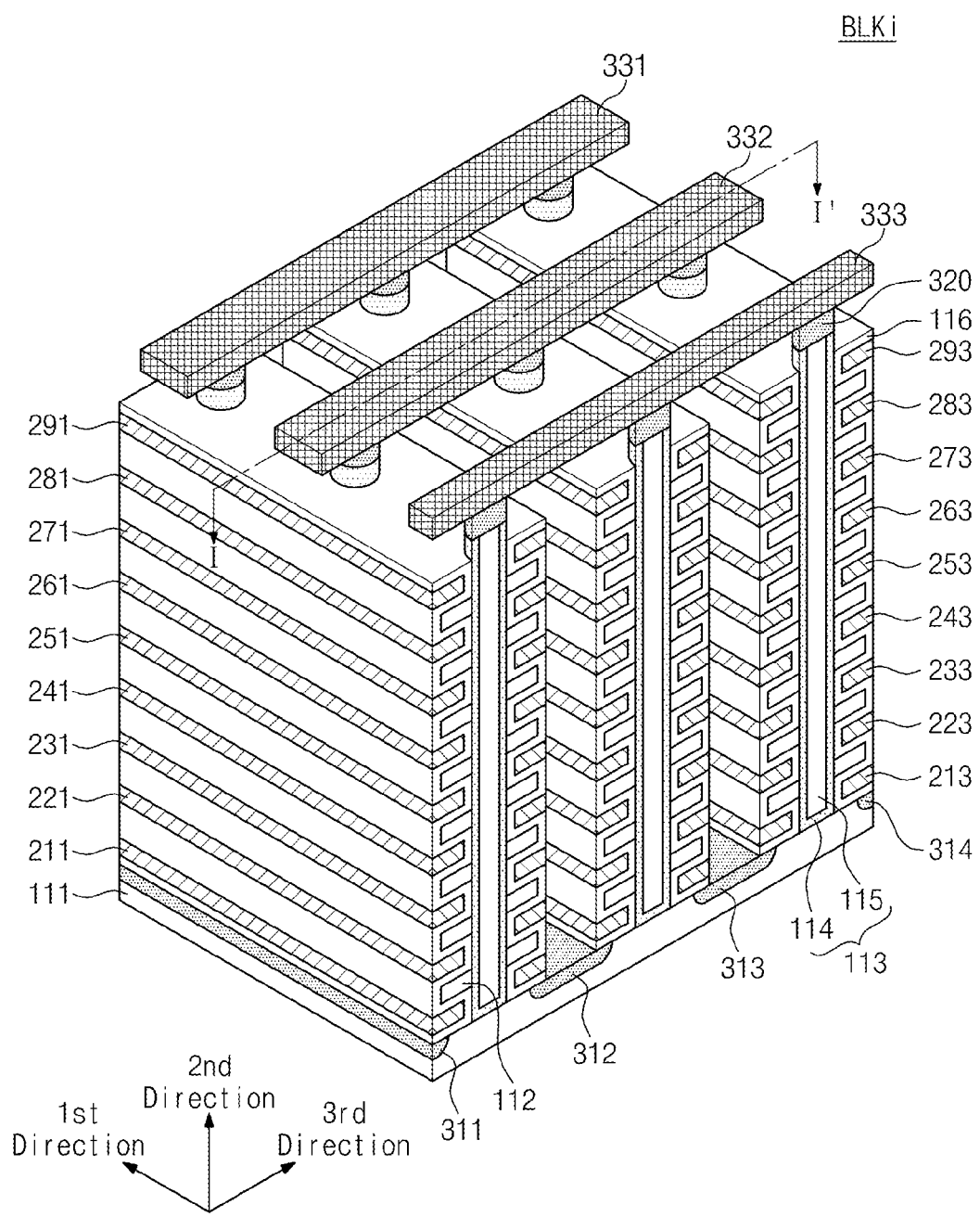
Figure 13:
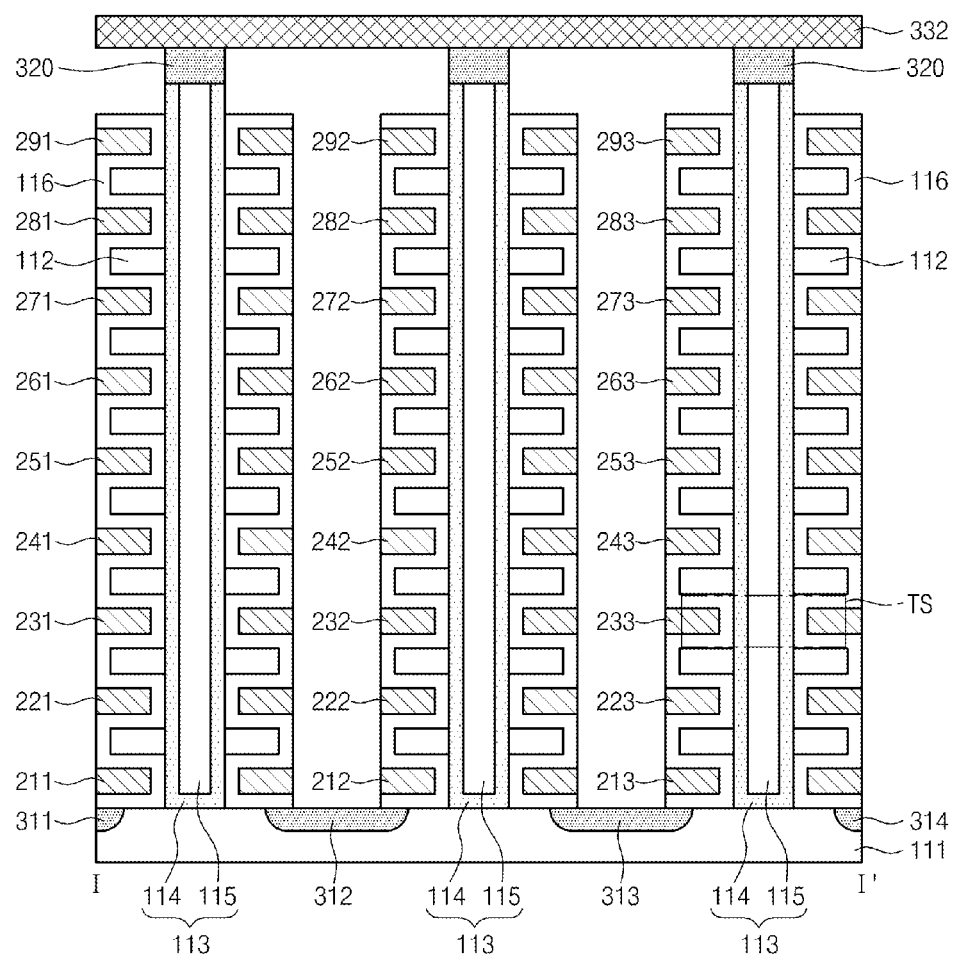

FIG. 12 is a perspective view of one memory block BLKi of FIG. 11. FIG. 13 is a cross-sectional view taken along a line XIII-XIII' of the memory block BLKi of FIG. 12. Referring to FIGS. 12 and 13, a memory block BLKi may include structures extending along first to third directions.

First, a substrate 111 may be provided. The substrate 111 may include a silicon material doped by a first type impurity. For example, the substrate 111 may include a silicon material doped by a p-type impurity or be a p-type well (e.g., a pocket p-well). The substrate 111 may further include an n-type well surrounding the p-type well. Below, it is assumed that the substrate 111 is p-type silicon. However, the substrate 111 is not limited to p-type silicon as a material. A plurality of doping regions 311 to 314 extending along the first direction may be provided on the substrate 111.

For example, the plurality of doping regions 311 to 314 may have a second type differing from that of the substrate 111. For example, the plurality of doping regions 311 to 314 may be n-type. Below, it is assumed that the first to fourth doping regions 311 to 314 are n-type. However, the first to fourth doping regions 311 to 314 are not limited to n-type. A plurality of insulation materials 112 extending along the first direction may be sequentially provided along the second direction over a region of the substrate 111 between the first and second doping regions 311 and 312. For example, the plurality of insulation materials 112 may be provided along the second direction such that they are spaced apart by a predetermined or desired distance. For example, the plurality of insulation materials 112 may be provided to be spaced apart from each other along the second direction. The insulation materials 112 may include an insulator such as silicon oxide, but example embodiments of inventive concepts are not limited thereto.

A plurality of pillars 113 may be sequentially provided on a region of the substrate 111 between the first doping region 311 and the second doping region 312, and may be formed to penetrate the insulation materials 112 along the second direction. The plurality of pillars 113 may penetrate the insulation materials 112 to contact the substrate 111.

Each of the pillars 113 may include (or be composed of) a plurality of materials. For instance, a surface layer 114 of each pillar 113 may include a silicon material having a first type. For example, the surface layer 114 of each pillar 113 may include a silicon material which is doped with the same type as that of the substrate 111. Hereinafter, it is assumed that the surface layer 114 of each pillar 113 includes p-type silicon. However, the surface layer 114 of each pillar 113 is not limited to being p-type silicon.

An inner layer 115 of each pillar 113 may be formed of an insulation material. For example, the inner layer 115 of each pillar 113 may be filled with an insulation material such as silicon oxide.

In a region between the first and second doping regions 311 and 312, an insulation layer 116 may be provided along exposed surfaces of the insulation materials 112, the pillars 113, and the substrate 111. For example, the thickness of the insulation material 116 may be less than a half of the distance between the insulation materials 112. That is, a region, in which any material other than the insulation materials 112 and the insulation layer 116 is disposed, may be provided between the insulation layer 116 provided on an undersurface of the first insulation material of the insulation materials 112 and the insulation layer 116 provided on a top surface of the second insulation material under the first insulation material.

In the region between the first and second doping regions 311 and 312, conductive materials 211 to 291 may be provided on an exposed surface of the insulation layer 116. For example, the conductive material 211 extending along the first direction may be provided between the substrate 111 and the insulation layer 112 adjacent thereto. More specifically, the conductive material 211 extending along the first direction may be provided between the substrate 111 and the insulation layer 116 disposed under the insulation material 112 adjacent to the substrate 111.

A conductive material extending along the first direction may be provided between the insulation layer 116 on a top surface of a specific insulation material among the insulation materials 112 and the insulation layer 116 disposed on an undersurface of an insulation layer provided on a top of the specific insulation material. Also, the conductive material 291 extending along the first direction may be provided on the insulation materials 112. For example, the conductive materials 211 to 291 extending along the first direction may be a metallic material. For example, the conductive materials 211 to 291 extending along the first direction may be a conductive material such as polysilicon.

A structure identical to a structure disposed on the first and second doping regions 311 and 312 may be provided in a region between the second and third doping regions 312 and 313. For example, the plurality of insulation materials 112 extending along the first direction, the plurality of pillars 113 which are sequentially arranged in the first direction and penetrate the plurality of insulation materials 113 in the third direction, the insulation layer 116 provided on exposed surfaces of the plurality of insulation materials 112 and the plurality of pillars 112, and the plurality of conductive materials 212 to 292 extending along the first direction may be provided in the region between the second and third doping regions 312 and 313.

A structure identical to a structure disposed on the first and second doping regions 311 and 312 may be provided in a region between the third and fourth doping regions 313 and 314. For example, the plurality of insulation materials 112 extending along the first direction, the plurality of pillars 113 which are sequentially arranged in the first direction and penetrate the plurality of insulation materials 113 in the third direction, the insulation layer 116 provided on exposed surfaces of the plurality of insulation materials 112 and the plurality of pillars 112, and the plurality of conductive materials 213 to 293 extending along the first direction may be provided in the region between the third and fourth doping regions 313 and 314.

Drains 320 may be respectively provided on the plurality of pillars 113. For example, the drains 320 may include a silicon material doped with a second type material. For example, the drains 320 may include a silicon material doped with an n-type material. Hereinafter, it is assumed that the drains 320 include a silicon material doped with an n-type material. However, the drains 320 are not limited to include n-type silicon materials. In example embodiments, a width of each drain 320 may be wider than that of a corresponding pillar 113. For example, each drain 320 may be provided on a top surface of the corresponding pillar 113 in a pad shape.

Conductive materials 331 to 333 extending in the third direction may be respectively connected on the drains 320. The conductive materials 331 to 333 may be sequentially disposed along the first direction. The conductive materials 331 to 333 may be respectively connected to the drains 320 in the corresponding region. For example, the drains 320 and the second conductive material 333 extending along the third direction may be connected to each other through respective contact plugs. For example, the conductive materials 331 to 333 extending along the third direction may be a metallic material. For example, the conductive materials 331 to 333 may be a conductive material such as polysilicon.

In FIGS. 12 and 13, each of the pillars 113 may form a string together with an adjacent region of the insulation layer 116 and an adjacent region of the plurality of conductive materials 211 to 291, 212 to 292, and 213 to 293. For example, each pillar 113 may form a NAND string NS together with an adjacent region to the insulation layer 116 and an adjacent region of the first conductive materials 211 to 291, 212 to 292, and 213 to 293 extending along the first direction. The NAND string NS may include a plurality of transistor structures TS. The transistor structure TS will be more fully described with reference to FIG. 14.

Figure 14:
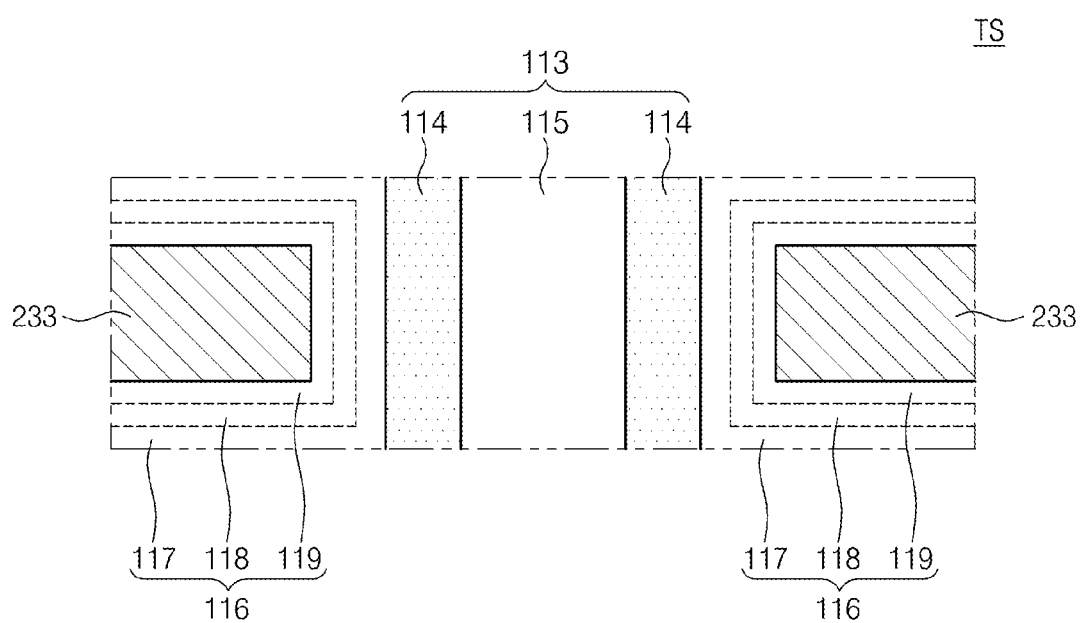

FIG. 14 is a cross-sectional view of a transistor structure TS of FIG. 13. Referring to FIGS. 12 to 14, an insulation layer 116 may include first to third sub insulation layers 117, 118 and 119.

P-type silicon 114 of a pillar 113 may act as a body. The first sub insulation layer 117 adjacent to the pillar 113 may act as a tunneling insulation layer. For example, the first sub insulation layer 117 adjacent to the pillar 113 may include a thermal oxide layer.

The second sub insulation layer 118 may act as a charge storage layer. For example, the second sub insulation layer 118 may act as a charge trap layer. For example, the second sub insulation layer 118 may include a nitride layer or a metal oxide layer (e.g., aluminum oxide layer, hafnium oxide layer, etc.).

The third sub insulation layer 119 adjacent to a conductive material 233 may act as a blocking insulation layer. For example, the third sub insulation layer 119 adjacent to a conductive material 133 extending along a first direction may have a mono-layered or multi-layered structure. The third sub insulation layer 119 may be a high dielectric layer (e.g., aluminum oxide layer, hafnium oxide layer, etc.) having a higher dielectric constant than the first and second sub insulation layers 117 and 118.

The conductive material 233 may act as a gate (or control gate). That is, the gate (or control gate) 233, the blocking insulation layer 119, the charge trap layer 118, the tunneling insulation layer 117, and the body 114 may form a transistor (or memory cell transistor structure). For example, the first to third sub insulation layers 117 to 119 may form an ONO structure (oxide-nitride-oxide). Hereinafter, the p-type silicon 114 of the pillar 113 may be defined to act as the body in the second direction.

The memory block BLKi may include a plurality of pillars 113. That is, the memory block BLKi may include a plurality of NAND strings NS. More specifically, the memory block BLKi may include a plurality of NAND strings NS extending along a second direction (or, a direction perpendicular to a substrate).

Each of the NAND strings NS may include a plurality of transistor structures TS which are stacked in a second direction. At least one of the plurality of transistor structures TS of each NAND string NS may act as a string select transistor SST. At least one of the plurality of transistor structures TS of each NAND string may act as a ground select transistor GST.

The gates (or control gates) may correspond to the conductive materials 211 to 291, 212 to 292, and 213 to 293 extending along the first direction. That is, the gates (or control gates) may form word lines WL extending along the first direction and at least two select lines (e.g., at least one string select line SSL and at least one ground select line GSL).

The conductive materials 331 to 333 extending along the third direction may be connected to one ends of the NAND strings NS. For example, the conductive materials 331 to 333 extending along the third direction may act as bit lines BL. That is, in one memory block BLKi, one bit line BL may be connected to the plurality of NAND strings.

The second type doping regions 311 to 314 extending along the first direction may be provided at the other ends of the NAND strings NS. The second type doping regions 311 to 314 extending along the first direction may act as common source lines CSL.

In summary, the memory block BLKi may include the plurality of NAND strings NS extending along a direction (second direction) perpendicular to the substrate 111, and may operate as a NAND flash memory block (e.g., charge trap type) in which the plurality of NAND strings NS is connected to one bit line BL.

While FIGS. 12 to 14 illustrate conductive materials 211 to 291, 212 to 292, and 213 to 293 extending along the first direction as nine layers. However, the first conductive materials 211 to 291, 212 to 292, and 213 to 293 extending along the first direction are not limited to being nine layers. For example, the conductive materials extending along the first direction may be provided as 8, 16 or more layers. In other words, a NAND string may include 8, 16 or more transistors.

While FIGS. 12 to 14 illustrate three NAND strings NS are connected to one bit line BL, example embodiments of inventive concepts are not limited to such a case. For example, in the memory block BLKi, m NAND strings NS may be connected to one bit line BL, and m may be an integer that is different than 3 or equal to 3. Here, the number of the conductive materials 211 to 291, 212 to 292, and 213 to 293 extending along the first direction and the number of common source lines 311 to 314 may also be adjusted so as to correspond to the number of NAND strings NS connected to one bit line BL.

While FIGS. 12 to 14 illustrate three NAND strings NS connected to one conductive material extending along the first direction, example embodiments of inventive concepts are not limited to such a case. For example, n NAND strings NS may be connected to one conductive material, and n may be an integer that is different than 3 or equal to 3. Here, the number of the conductive materials 331 to 333 extending along the third direction may also be adjusted to correspond to the number of NAND strings NS connected to one conductive material.

Figure 15:
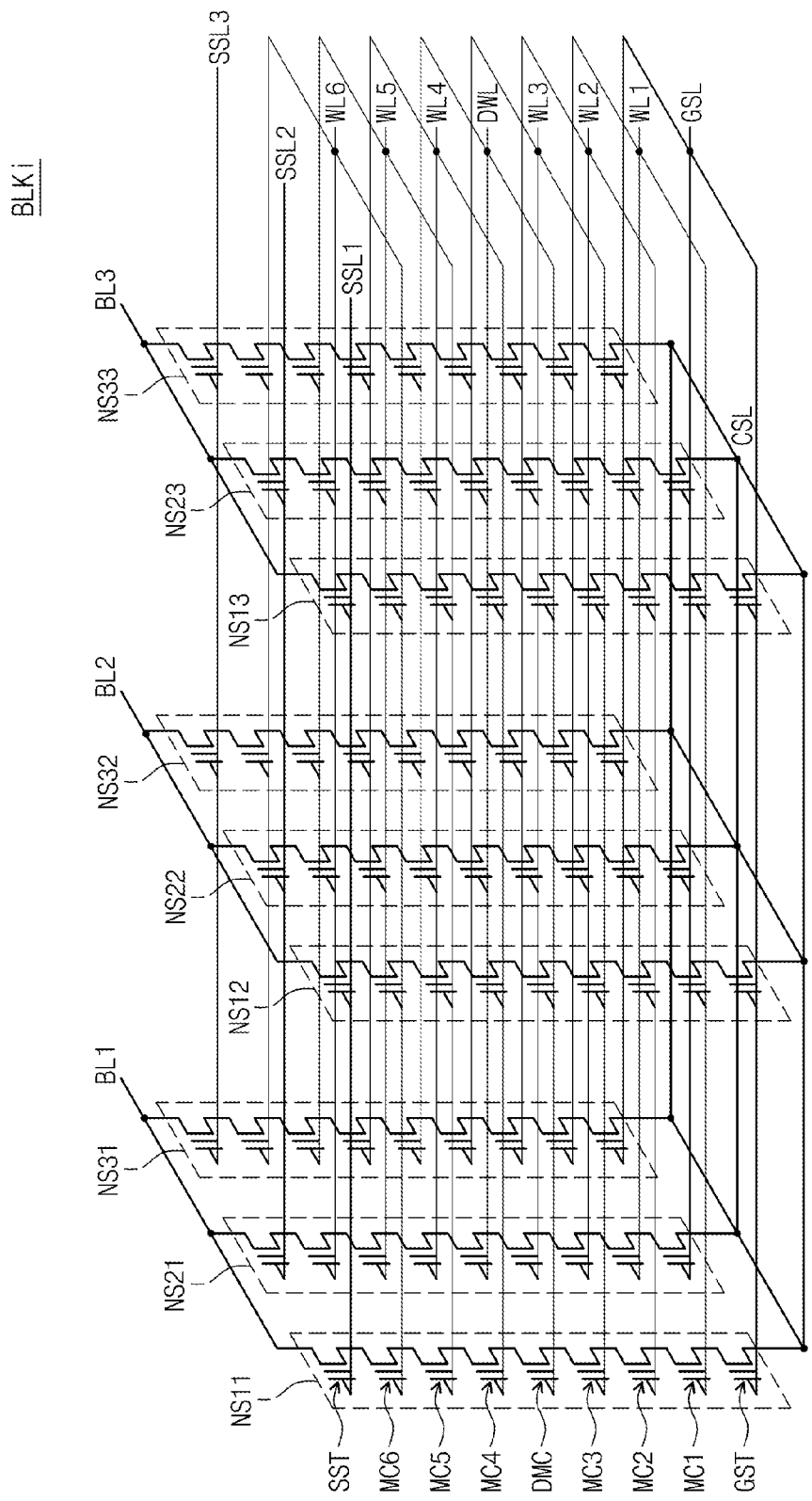

FIG. 15 is an equivalent diagram of a memory block BLKi described with reference to FIGS. 12 to 14. Referring to FIGS. 12 to 15, NAND strings NS11 to NS31 may be provided between a first bit line BL1 and a common source line CSL. NAND strings NS12, NS22 and NS32 may be provided between a second bit line BL2 and the common source line CSL. NAND strings NS13, NS23 and NS33 may be provided between a third bit line BL3 and the common source line CSL. The third bit line BL3 may correspond to a conductive material 333 extending along a third direction.

A string select transistor SST of each NAND string NS may be connected to a corresponding bit line BL. A ground select transistor GST of each NAND string NS may be connected to the common source line CSL. Memory cells MC may be provided between the string select transistor SST and the ground select transistor GST of each NAND string NS.

Hereinafter, the NAND strings NS may be defined in units of rows and columns. The NAND strings NS commonly connected to one bit line may form one column. For example, the NAND strings NS11 to NS 31 connected to the first bit line BL1 may correspond to a first column. The NAND strings NS12 to NS 32 connected to the second bit line BL2 may correspond to a second column. The NAND strings NS13 to NS 33 connected to the third bit line BL3 may correspond to a third column. The NAND strings NS connected to one string select line SSL may form one row. For example, the NAND strings NS11 to NS13 connected to a first string select line SSL1 may form a first row. The NAND strings NS21 to NS23 connected to a second string select line SSL2 may form a second row. The NAND strings NS31 to NS33 connected to a third string select line SSL3 may form a third row.

A height may be defined in each NAND string NS. For example, the height of the ground select transistor GST may be defined as 1 in each NAND string NS. In each NAND string NS, the closer to the string selection transistor SST, the higher the height of a memory cell. In each NAND string NS, the height of the memory cell MC6 adjacent to the string select transistor SST may be defined as 6.

The string select transistors SST of the NAND strings NS of the same row may share the string select line SSL. The string select transistors SST of the NAND strings NS in different rows may be connected with different string select lines SSL1, SSL2, and SSL3, respectively.

The memory cells MC having the same height in the NAND strings NS of the same row may share the word line WL. The word lines WL of the NAND strings NS which have the same height and correspond to different rows may be commonly connected. Dummy memory cells DMC having the same height in the NAND strings NS of the same row may share a dummy word line DWL. The dummy word lines DWL of the NAND strings NS which have the same height and are connected to dummy memory cells DMC of the NAND strings NS in different rows may be commonly connected.

For example, the word lines WL or the dummy word lines DWL may be commonly connected on layers where conductive materials 211 to 291, 212 to 292, and 213 to 293 extending in the first direction are provided.

For example, the conductive materials 211 to 291, 212 to 292, and 213 to 293 extending in the first direction may be connected to an upper layer via a contact. The conductive materials 211 to 291, 212 to 292, and 213 to 293 extending in the first direction may be connected in common at the upper layer. Ground select transistors GST of the NAND strings NS of the same row may share a ground select line GSL. The ground select transistors GST of the NAND strings NS in different rows may share the ground select line GSL. That is, the NAND strings NS11 to NS13, NS21 to NS23, and NS31 to NS33 may be connected in common to the ground select line GSL.

The common source line CSL may be commonly connected to all the NAND strings NS. For example, the first to fourth doping regions 311 to 314 may be connected at an active region of the substrate 111. For example, the first to fourth doping regions 311 to 314 may be connected to an upper layer via a contact. The first to fourth doping regions 311 to 314 may be connected in common at the upper layer.

As illustrated in FIG. 15, the word lines WL having the same height may be commonly connected. Therefore, when the word line WL with a specific height is selected, all of the NAND strings NS connected to the selected word line WL may be selected. The NAND strings NS of different rows may be connected to different string select lines SSL. Accordingly, among the NAND strings NS connected to the same word line WL, the NAND strings NS of the unselected row may be electrically isolated from the bit lines BL1 to BL3. That is, a row of the NAND strings NS may be selected by selecting the string select lines SSL1 to SSL3. The NAND strings NS of the selected row may be selected by the column unit by selecting the bit lines BL1 to BL3.

In each NAND string NS, a dummy memory cell DMC may be provided. The first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. Below, it is assumed that the memory cells MC in each NAND string NS are divided into memory cell groups by the dummy memory cell DMC. Memory cells (e.g., MC1 to MC3), adjacent to the ground select transistor GST, from among the divided memory cell groups may be referred to as a lower memory cell group. Memory cells (e.g., MC4 to MC6), adjacent to the string select transistor SST, from among the divided memory cell groups may be referred to as an upper memory cell group.

Referring to FIGS. 11 to 15, a first hard decision read operation may be performed by applying a first voltage to a first word line connected with memory cells arranged in a direction perpendicular to a substrate. A result of the first hard decision read operation may be stored at a first latch. A second hard decision read operation may be performed by applying a second voltage higher than the first voltage sequentially. The second voltage may be applied to the first word line. A first soft decision value may be formed using the result of the first hard decision read operation stored at the first latch, without applying of a first soft decision read voltage.

Figure 16:
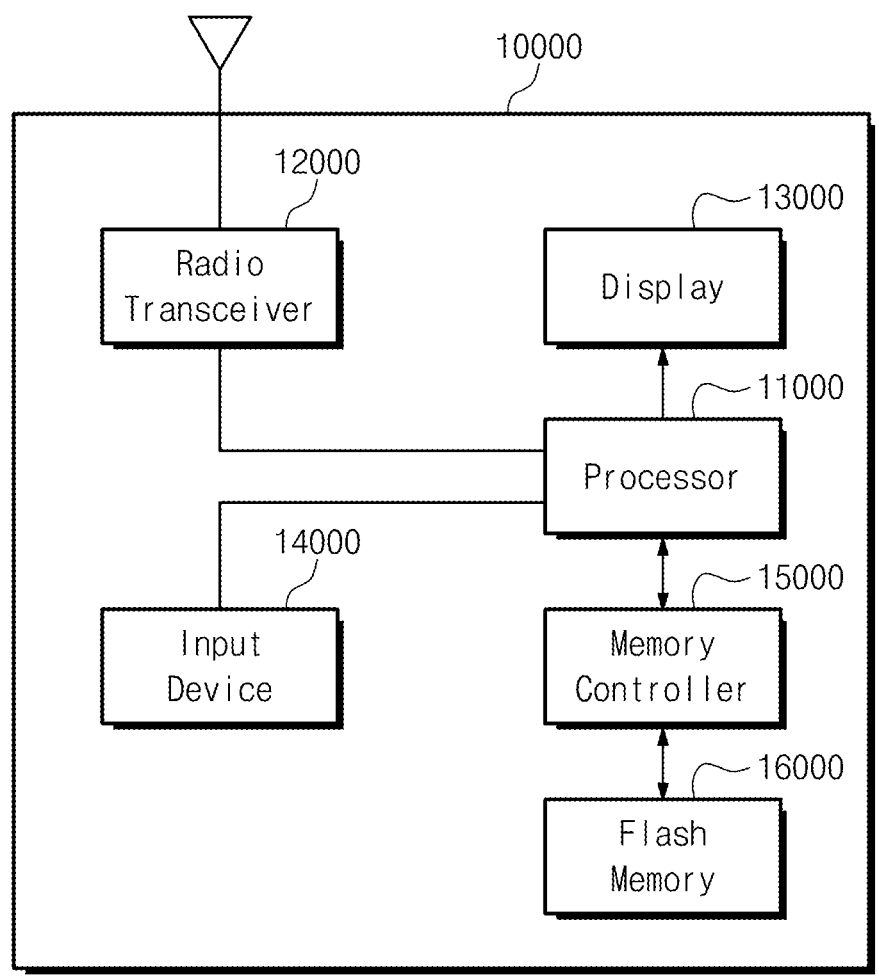
FIG. 16 is a block diagram schematically illustrating an electronic device including a memory controller and a non-volatile memory device according to an example embodiment of inventive concepts.

FIG. 16 is a block diagram schematically illustrating an electronic device 10000 including a memory controller 15000 and a non-volatile memory device 16000 according to an example embodiment of inventive concepts.

Referring to FIG. 16, an electronic device 10000 such as a cellular phone, a smart phone, or a tablet PC may include a non-volatile memory device 16000 and a memory controller 15000 to control the non-volatile memory device 16000. The non-volatile memory device 16000 may be implemented as a flash memory device.

The memory controller 15000 may be controlled by a processor 11000 which controls an overall operation of the electronic device 10000.

Data stored at the non-volatile memory device 16000 may be displayed through a display 13000 according to a control of the memory controller 15000 which operates according to a control of the processor 11000.

A radio transceiver 12000 may change a radio signal through an antenna. For example, the radio transceiver 12000 may convert a radio signal received through the antenna into a signal capable of being processed by the processor 11000. Thus, the processor 11000 may process a signal from the radio transceiver 12000, and may store the processed signal at the non-volatile memory device 16000. Or, the processor 11000 may display the processed signal through the display 13000.

The radio transceiver 12000 may convert a signal from the processor 11000 into a radio signal, and may output the converted radio signal to the exterior through the antenna.

An input device 14000 may be a device that receives a control signal for controlling an operation of the processor 11000 or data to be processed by the processor 11000, and may be implemented by a pointing device such as a touch pad or a computer mouse, a key pad, or a keyboard.

The processor 11000 may control the display 13000 such that data from the non-volatile memory device 16000, a radio signal from the radio transceiver 12000 or data from the input device 14000 is displayed through the display 13000.

Figure 17:
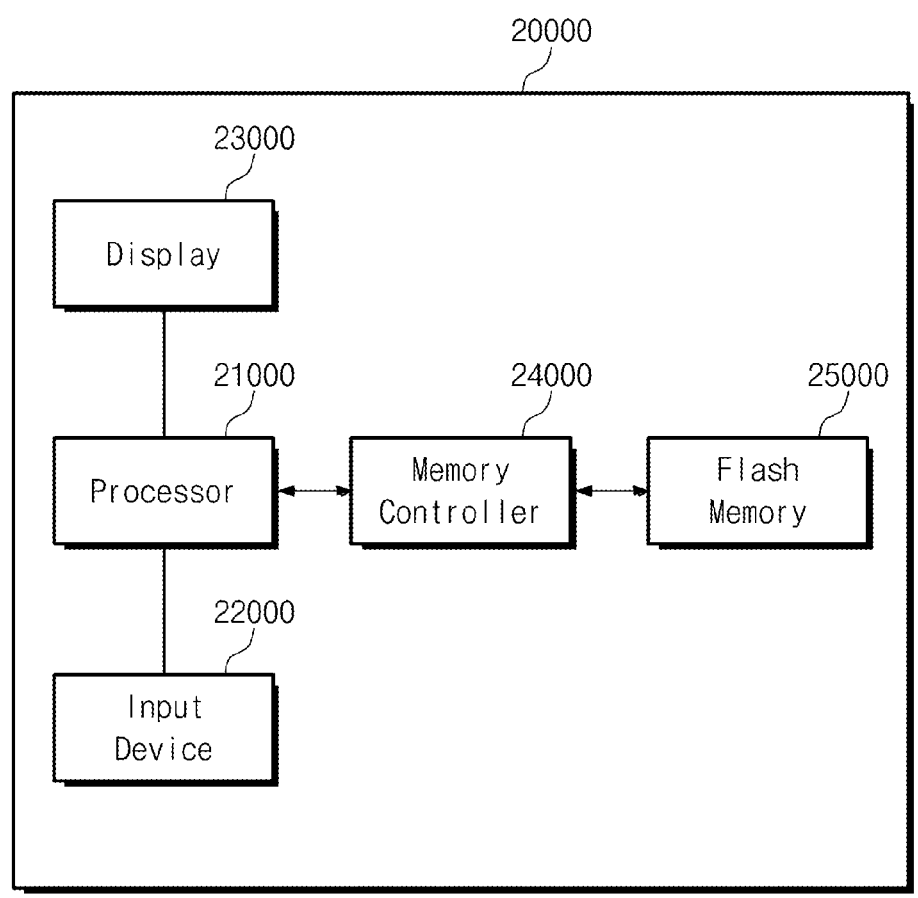
FIG. 17 is a block diagram schematically illustrating an electronic device including a memory controller and a non-volatile memory device according to another example embodiment of inventive concepts.

FIG. 17 is a block diagram schematically illustrating an electronic device 20000 including a memory controller 24000 and a non-volatile memory device 25000 according to another example embodiment of inventive concepts.

Referring to FIG. 17, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and may include a non-volatile memory device 25000 (e.g., a flash memory device) and a memory controller 24000 to control an operation of the non-volatile memory device 25000.

The non-volatile memory device 25000 may be a non-volatile memory device illustrated in FIGS. 1 to 15. The non-volatile memory device 25000 may store random data.

The electronic device 20000 may include a processor 21000 to control an overall operation of the electronic device 20000. The memory controller 24000 may be controlled by the processor 21000.

The processor 21000 may display data stored at the non-volatile memory device 25000 through a display 23000 according to an input signal generated by an input device 22000. For example, the input device 22000 may be implemented by a pointing device such as a touch pad or a computer mouse, a key pad, or a keyboard.

Figure 18:
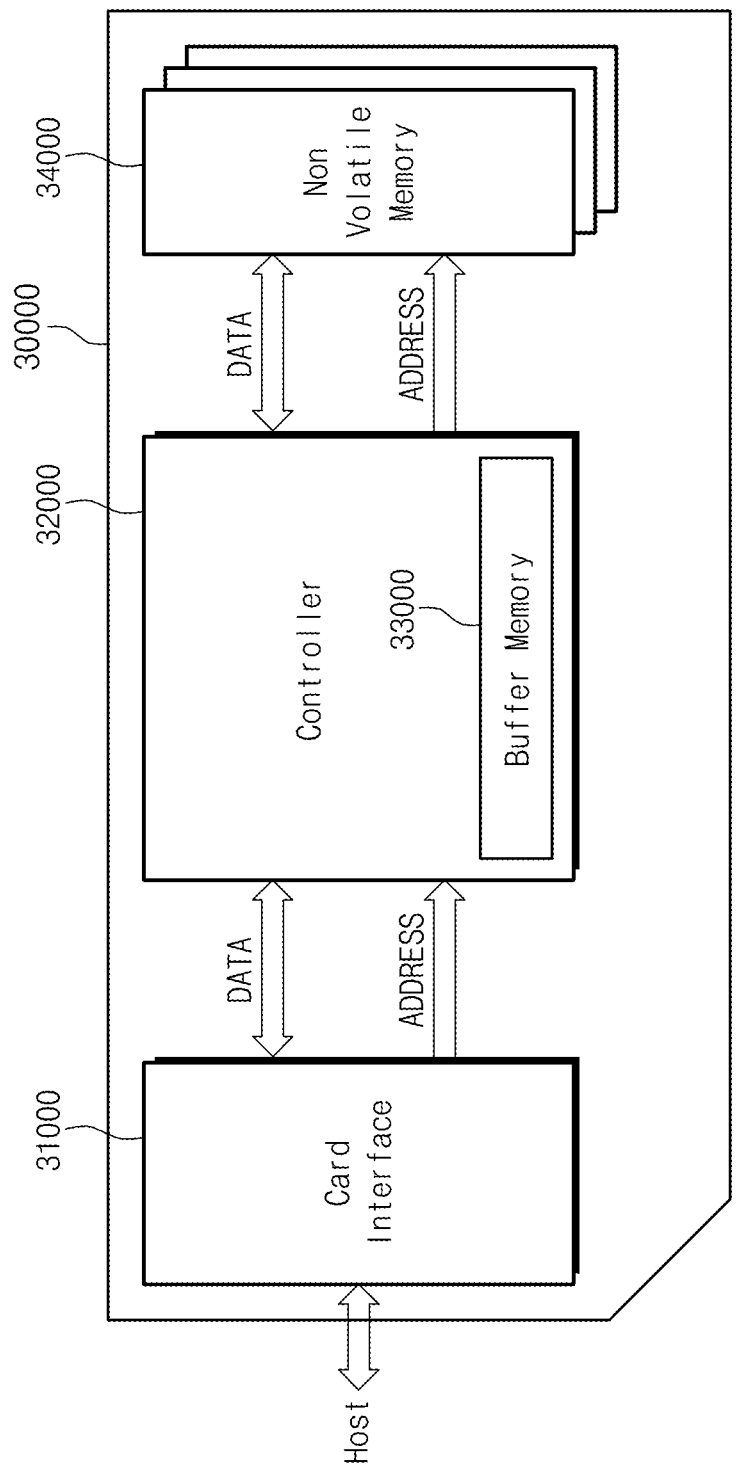
FIG. 18 is a block diagram schematically illustrating an electronic device including a non-volatile memory device according to still another example embodiment of inventive concepts.

FIG. 18 is a block diagram schematically illustrating an electronic device 30000 including a non-volatile memory device 34000 according to still another example embodiment of inventive concepts.

Referring to FIG. 18, an electronic device 30000 may include a card interface 31000, a memory controller 32000, and a non-volatile memory device 34000 (e.g., a flash memory device).

The electronic device 30000 may exchange data with a host through the card interface 31000. The card interface 31000 may be an SD (Secure Digital) card interface or an MMC (Multi-Media Card) interface. However, example embodiments of inventive concepts are not limited thereto. The card interface 31000 may interface data exchange between the host and the memory controller 32000 according to the communications protocol of the host capable of communicating the electronic device 30000.

The memory controller 32000 may control an overall operation of the electronic device 30000, and may control exchange of data between the card interface 31000 and the non-volatile memory device 34000. A buffer memory 33000 of the memory controller 32000 may buffer data transferred between the card interface 31000 and the non-volatile memory device 34000.

The memory controller 32000 may be connected with the card interface 31000 and the non-volatile memory device 34000 through a data bus DATA and an address bus ADDRESS. According to an example embodiment of inventive concepts, the memory controller 32000 may receive an address of data to be read or written from the card interface 31000 through the address bus ADDRESS, and may send it to the non-volatile memory device 34000.

Also, the memory controller 32000 may receive or transfer data to be read or written through the data bus DATA connected with the card interface 31000 or the non-volatile memory device 34000.

The non-volatile memory device 34000 may be a non-volatile memory device illustrated in FIGS. 1 to 15. The non-volatile memory device 34000 may store random data.

When the electronic device 30000 is connected with a host such as a PC, a tablet PC, a digital camera, a digital audio player, a mobile phone, console video game hardware or a digital set-top box, the host may exchange data stored at the non-volatile memory device 34000 through the card interface 31000 and the memory controller 32000.

Figure 19:
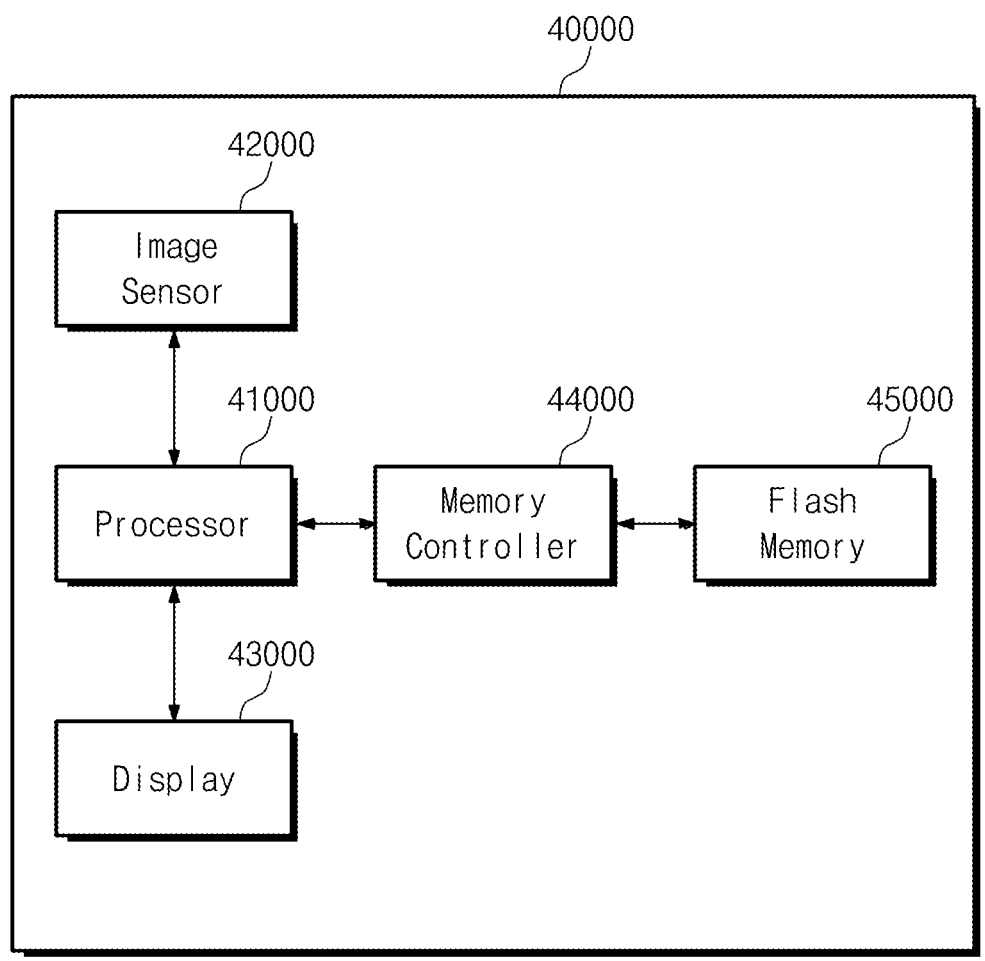
FIG. 19 is a block diagram schematically illustrating an electronic device including a memory controller and a non-volatile memory device according to still another embodiment of the inventive concept.

FIG. 19 is a block diagram schematically illustrating an electronic device including a memory controller and a non-volatile memory device according to still another example embodiment of inventive concepts.

Referring to FIG. 19, an electronic device 40000 may include a non-volatile memory device 45000 (e.g., a flash memory device), a memory controller 44000 to control a data processing operation of the non-volatile memory device 45000, and a processor 41000 to control an overall operation of the electronic device 40000.

The non-volatile memory device 45000 may be a non-volatile memory device illustrated in FIGS. 1 to 15.

An image sensor 42000 of the electronic device 40000 may convert an optical signal into a digital signal, and the converted digital signal may be stored at the non-volatile memory device 45000 under the control of the processor 41000. Or, the converted digital signal may be displayed through a display 43000 under the control of the processor 41000.

Figure 20:
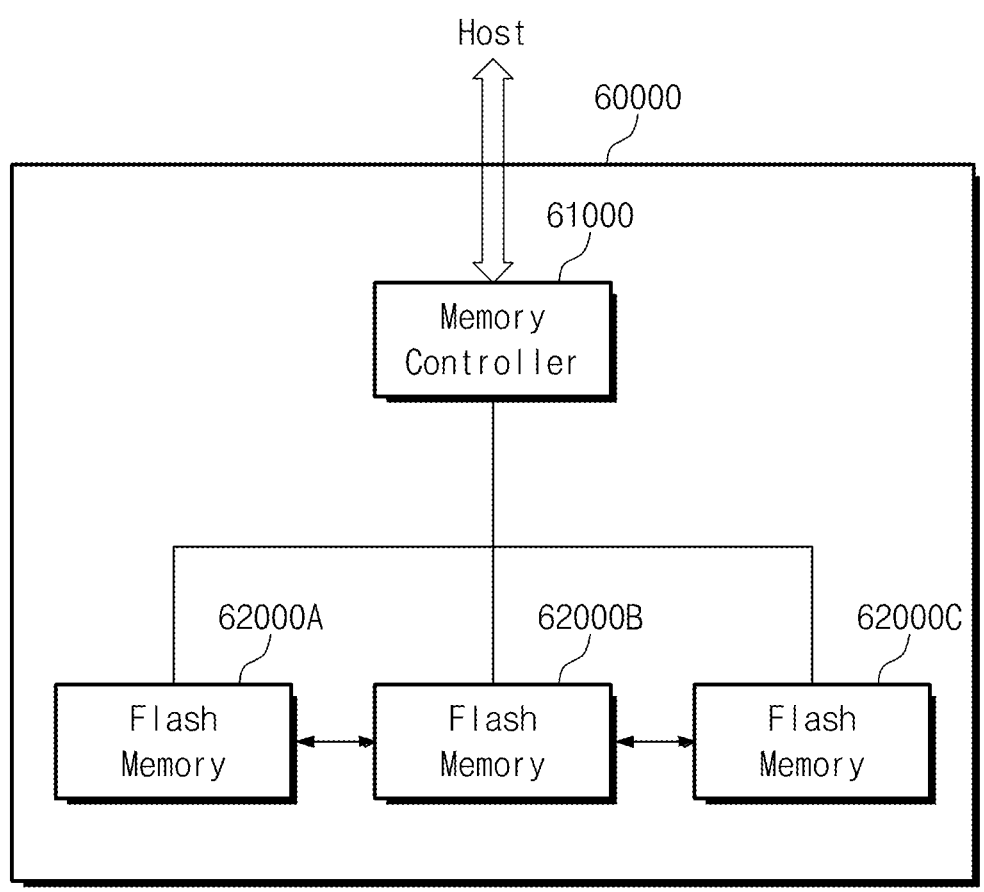
FIG. 20 is a block diagram schematically illustrating an electronic device including a memory controller and non-volatile memory devices according to still another example embodiment of inventive concepts.

FIG. 20 is a block diagram schematically illustrating an electronic device 60000 including a memory controller 61000 and non-volatile memory devices 62000A, 62000B, and 62000C according to still another example embodiment of inventive concepts.

Referring to FIG. 20, an electronic device 60000 may be implemented by a data storage device such as a solid state drive (SSD).

The electronic device 60000 may include non-volatile memory devices 62000A, 62000B, and 62000C and a memory controller 61000 to control a data processing operation of each of the non-volatile memory devices 62000A, 62000B, and 62000C.

The electronic device 60000 may be implemented by a memory system or a memory module.

Each of the non-volatile memory devices 62000A, 62000B, and 62000C may mean a non-volatile memory device illustrated in FIGS. 1 to 15. The non-volatile memory devices 62000A, 62000B, and 62000C may store random data.

The memory controller 61000 may be implemented outside or inside electronic device 60000 according to an example embodiment of inventive concepts.

Figure 21:
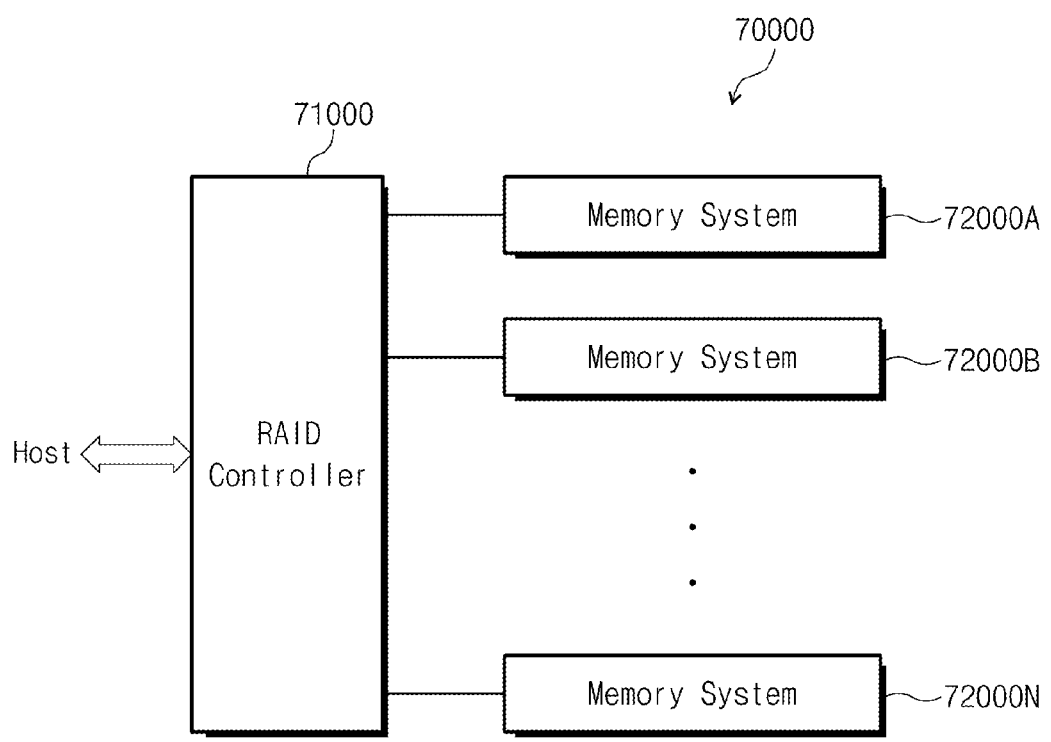
FIG. 21 is a block diagram of a data processing system including an electronic device illustrated in FIG. 20.

FIG. 21 is a block diagram of a data processing system including an electronic device illustrated in FIG. 20.

Referring to FIGS. 20 and 21, a data storage device 70000 may be implemented by a RAID (Redundant Array of Independent Disks) system. The data storage device 70000 may include a RAID controller 71000 and a plurality of memory systems 72000A to 72000N (N being a natural number).

Each of the memory systems 72000A to 72000N may be an electronic device 40000 in FIG. 19. The memory systems 72000A to 72000N may form an RAID array. The data storage device 70000 may be implemented by a personal computer or an SSD.

During a program operation, the RAID controller 71000 may output program data output from a host to one of the memory systems 72000A to 72000N according to one selected from a plurality of RAID levels based on RAID level information output from the host.

During a read operation, the RAID controller 71000 may transfer data read from one of the memory systems 72000A to 72000N to the host according to one selected from a plurality of RAID levels based on RAID level information output from the host.

While some example embodiments have been particularly shown and described, it will be understood by one of ordinary skill in the art that variations in form and detail may be made therein without departing from the spirit and scope of the claims.

What is claimed is:

1. A method of operating a non-volatile memory device, comprising:
performing a first hard decision read operation that includes applying a first read voltage to a selected word line of the non-volatile memory device;
storing a result of the first hard decision read operation at a first latch of a page buffer in the non-volatile memory device;
performing a second hard decision read operation that includes generating hard decision data by applying a second read voltage to the selected word line, the second read voltage being higher than the first read voltage;
generating a first soft decision value using a result of the first hard decision read operation stored at the first latch without applying a first soft decision read voltage to the selected word line;
storing the first soft decision value at a second latch of the page buffer;
generating a second soft decision value by applying a soft decision read voltage to the selected word line, the soft decision read voltage being higher than the second read voltage; storing the second soft decision value at a third latch of the page buffer; and
generating soft decision data using the page buffer by performing a logical operation on the first soft decision value and the second soft decision value.

2. The method of claim 1, wherein the first hard decision read operation is a coarse read operation.

3. The method of claim 1, wherein the second hard decision read operation is a fine read operation.

4. The method of claim 1, further comprising:
performing an additional error bit correction operation using the soft decision data if an error bit correction operation on the result of the second hard decision read operation fails.

5. The method of claim 1, wherein the logical operation is an XNOR operation.

6. The method of claim 1, further comprising:
performing an error correction operation using the hard decision data; and
performing an additional error correction operation using the soft decision data if the error correction operation using the hard decision data fails.

7. The method of claim 1, wherein
at execution of the applying the soft decision read voltage, selectively pre-charging bit lines connected to memory cells of the non-volatile device based on the result of the second hard decision read operation.

8. The method of claim 1, further comprising:
performing a third hard decision read operation using a fourth voltage that is higher than the third voltage; and
at execution of the applying the soft decision read voltage, selectively pre-charging bit lines connected to memory cells of the non-volatile memory device that each have a threshold voltage between the second and the fourth voltage if results of the second hard decision read operation and the third hard decision read operation are stored in the page buffer.

9. A method of operating a non-volatile memory device, comprising:
performing a first read operation that includes applying a first voltage to a selected word line of the non-volatile memory device;
storing a result of the first read operation at a first latch of a page buffer of the non-volatile memory device;
performing a second read operation that includes applying a second voltage to the selected word line, the second voltage being higher than the first voltage;
performing an error correction operation on a result of the second read operation; and
performing an additional error correction operation using soft decision data if the error correction operation on the result of the second read operation fails,
generating the soft decision data by,
performing a third read operation that includes applying a third voltage to the selected word line, the third voltage being higher than the second voltage,
storing a result of the third read operation in another latch of the page buffer, and
performing a logical operation using the result of the first read operation stored in the first latch and the result of the third read operation stored in the other latch.

10. The method of claim 3, wherein the logical operation is an XNOR operation.

11. The method of claim 9, wherein
the first read operation is a coarse read operation, and
the second read operation is a fine read operation.

12. The method of claim 9, further comprising:
selectively pre-charging bit lines connected to memory cells of the non-volatile memory device, based on the result of the second read operation, at execution of the third read operation.

13. The method of claim 9, wherein
the non-volatile memory device includes a plurality of a NAND strings arranged in rows and columns,
each NAND strings includes a plurality of memory cells stacked vertically on each other between a ground selection transistor and a string selection transistor,
the non-volatile memory device includes a plurality of bit lines,
each one of the plurality of bit lines is connected to the plurality of NAND strings in a same column,
the selected word line is one of a plurality of word lines in the non-volatile memory device, and
each one of the plurality of word lines is connected to a corresponding one of the plurality of memory cells at a same height in the plurality of NAND strings in a same row.

14. A method of operating a non-volatile memory device, comprising:
performing a first hard decision read operation that includes applying a first voltage to a selected word line of the non-volatile memory device;
storing a result of the first hard decision read operation at a first latch of a page buffer in the non-volatile memory device;
performing a second hard decision read operation that includes applying a second voltage to the selected word line, the second voltage being higher than the first voltage;
generating a first soft decision value using a result of the first hard decision read operation stored at the first latch;
generating a second soft decision value by performing a soft decision read operation that includes applying a third voltage to the selected word line, the third voltage being higher than the second voltage; and
performing a pre-charge operation based on a result of the second hard decision read operation, the pre-charge operation including being one of:
selectively pre-charging bit lines connected to off-state cells of the non-volatile memory device, based on the result of the second hard decision read operation, at execution of the soft decision read operation, the off-state cells each having a threshold voltage higher than the second voltage, and
performing a third hard decision read operation using a fourth voltage that is higher than the third voltage, and selectively pre-charging bit lines connected to memory cells of the non-volatile memory device having a threshold voltage between the second and the fourth voltage, at execution of the soft decision read operation, if results of the second hard decision read operation and the third hard decision read operations are stored in the page buffer.

15. The method of claim 14, wherein the pre-charge operation based on the result of the second hard decision read operation is:
selectively pre-charging bit lines connected to off-state cells of the non-volatile memory device, based on the result of the second hard decision read operation, at execution of the soft decision read operation, the off-state cells each have a threshold voltage higher than the second voltage.

16. The method of claim 14, wherein the pre-charge operation based on the result of the second hard decision read operation is:
performing a third hard decision read operation using a fourth voltage that is higher than the third voltage; and
selectively pre-charging bit lines connected to memory cells of the non-volatile memory device having a threshold voltage between the second and the fourth voltage, at execution of the soft decision read operation, if results of the second hard decision read operation and the third hard decision read operations are stored in the page buffer.

17. The method of claim 14, wherein
generating the first soft decision value using the result of the first hard decision read operation stored at the first latch is performed without applying a first soft decision read voltage to the selected word line.

* * * * *